(12) United States Patent
Fainekos

(10) Patent No.: US 10,409,706 B2
(45) Date of Patent: Sep. 10, 2019

(54) AUTOMATED TEST GENERATION FOR STRUCTURAL COVERAGE FOR TEMPORAL LOGIC FALSIFICATION OF CYBER-PHYSICAL SYSTEMS

(71) Applicant: Georgios Fainekos, Phoenix, AZ (US)

(72) Inventor: Georgios Fainekos, Phoenix, AZ (US)

(73) Assignee: ARIZONA BOARD OF REGENTS ON BEHALF OF ARIZONA STATE UNIVERSITY, Scottsdale, AZ (US)

( * ) Notice: Subject to any disclaimer, the term of this patent is extended or adjusted under 35 U.S.C. 154(b) by 97 days.

(21) Appl. No.: 15/721,243

(22) Filed: Sep. 29, 2017

(65) Prior Publication Data

US 2018/0095861 A1 Apr. 5, 2018

Related U.S. Application Data

(60) Provisional application No. 62/401,989, filed on Sep. 30, 2016.

(51) Int. Cl.
 *G06F 9/44* (2018.01)
 *G06F 11/36* (2006.01)
 (Continued)

(52) U.S. Cl.
 CPC ........ *G06F 11/3608* (2013.01); *G06F 9/4498* (2018.02); *G06F 11/3604* (2013.01);
 (Continued)

(58) Field of Classification Search
 CPC .................................................. G06F 11/3608
 (Continued)

(56) References Cited

U.S. PATENT DOCUMENTS 6,587,960 B1 7/2003 Barford
7,574,334 B2 8/2009 Tiwari
(Continued)

FOREIGN PATENT DOCUMENTS

EP 1117044 7/2001

OTHER PUBLICATIONS

"Probabilistic Temporal Logic Falsification of Cyber-Physical Systems", by Houssam Abbas et al., Dec. 22, 2011, pp. 1-29, [online][retrieved on Feb. 28, 2019]. Retrieved from <<http://www.public.asu.edu/~gfaineko/pub/tech11_sa_fals.pdf>>.*

(Continued)

*Primary Examiner* — Evral E Bodden
(74) *Attorney, Agent, or Firm* — Quarles & Brady LLP

(57) ABSTRACT

One embodiment is a methodology for model verification. An embodiment obtaining, by a processor, a model for a system; identifying, by the processor, at least one block within the model that has a branching structure; identifying, by the processor, at least one model variable affecting a switching condition of the identified at least one block; generating, by the processor, an extended finite state machine modeling a switching behavior of the identified at least one block by using the at least one model variable; combining, by the processor, at least one output variable of the extended finite state machine with at least one of a first output port and a second output port of the system included in the model; and performing, by the processor, model verification and coverage of the model that utilizes outputs from the first output port and the second output port to verify the model.

6 Claims, 25 Drawing Sheets

(51) Int. Cl.
    *G06F 17/50*   (2006.01)
    *G06F 9/448*   (2018.01)
    *G06F 16/901*  (2019.01)
(52) U.S. Cl.
    CPC ...... *G06F 11/3676* (2013.01); *G06F 11/3684* (2013.01); *G06F 11/3696* (2013.01); *G06F 16/9024* (2019.01); *G06F 17/5009* (2013.01)
(58) Field of Classification Search
    USPC .................................... 717/181, 131
    See application file for complete search history.

(56) References Cited

U.S. PATENT DOCUMENTS

| | | | |
|---|---|---|---|
| 7,743,351 | B2 | 6/2010 | Granier |
| 7,865,339 | B2 | 1/2011 | Rushby |
| 8,374,840 | B2 | 2/2013 | Sankaranarayanan |
| 2008/0082968 | A1 | 4/2008 | Chang |
| 2008/0263505 | A1* | 10/2008 | StClair .............. G06F 8/10 717/101 |
| 2010/0094611 | A1 | 4/2010 | Sankaranarayanan |
| 2010/0125832 | A1 | 5/2010 | Prasad |
| 2010/0299651 | A1 | 11/2010 | Fainekos |
| 2012/0185820 | A1* | 7/2012 | Kadiyala ............ G06F 8/37 717/100 |
| 2013/0124164 | A1 | 5/2013 | Jha |
| 2016/0292307 | A1 | 10/2016 | Fainekos |

OTHER PUBLICATIONS

Abate et al., "Quantitative Automata Model Checking of Autonomous Stochastic Hybrid Systems", Hybrid Systems Computation and Control, (2011), pp. 83-92.
Abbas et al. Probabilistic temporal logic falsification of cyber-physical systems. ACM Transactions on Embedded Computing Systems 12(s2) May 2013.
Abbas et al., "Robustness-Guided Temporal Logic Testing and Verification for Stochastic Cyber-Physical Systems", 2014 IEEE 4th Annual International Conference on Cyber Technology in Automation, Control, and Intelligent Systems, (2014).
Abbas H. et al. "Computing descent direction of mtl robustness for non-linear systems" American Control Conference 2013.
Abbas H. et al. "Conformance testing as falsification for cyber-physical systems" Technical Report 1401.5200 arXiv 2014.
Abbas H. et al. "Convergence proofs for simulated annealing falsification of safety properties" Proc. of 50th Annual Allerton Conference on Communication Control and Computing 2012.
Abbas H. et al. "Formal property verification in a conformance testing framework" 12th ACM-IEEE International Conference on Formal Methods and Models for System Design 2014.
Abbas H. et al. "Functional gradient descent method for metric temporal logic specifications" American Control Conference 2014.
Abbas H. et al. "Linear hybrid system falsification through local search" in Automated Technology for Verification and Analysis Springer vol. 6996 pp. 503-510 2011.
Abbas, H. et al. "Probabilistic Temporal Logic Falsification of Cyber-Physical Systems," Dec. 22, 2011, pp. 1-29, [online][retrieved on Feb. 28, 2019].
Akazaki T., et al. "Time robustness in mtl and expressivity in hybrid system falsification" in Computer Aided Verification Springer vol. 9207 pp. 356-374 2015.
Annapureddy et al., "Ant Colonies for Temporal Logic Falsification of Hybrid Systems," 36th Annual Conference on IEEE Industrial Electronics Society, (2010).
Annapureddy et al., "S-TALIRo: A Tool for Temporal Logic Falsification for Hybrid Systems", Tools and Algorithms for the Construction and Analysis of Systems (TACAS), LNCS 6605, (2011 ), pp. 254-257.
Balluchi et al., "Hybrid Systems in Automotive Electronics Design", International Journal of Control, 79(5), (2006), pp. 375-394.

Bartocci et al., "On the Robustness of Temporal Properties for Stochastic Models", Hybrid Systems and Biology (HSB), (2013), pp. 3-19.
Branicky M. et al. "Sampling-based planning control and verification of hybrid systems" IEE Proc.-Control Theory Appl. vol. 153 No. 5 pp. 575-590 2006.
Calafiore et al., "Research on Probabilistic Methods for Control System Design," Automatica, 47(7), (2011), pp. 1279-1293.
Chen, X. et al. "Flow*: An analyzer for non-linear hybrid systems" Computer-Aided Verification 2013.
Clarke et al., "On Simulation-Based Probabilistic Model Checking of Mixed-Analog Circuits," Formal Methods in System Design, 36(2), (2010), pp. 97-113.
Clarke, et al. Statistical model checking of analog mixed-signal circuits with an application to a third order 5—a modulator. In Hardware and Software: Verification and Testing, vol. 5394 of LNCS, pp. 149-163. Springer, 2009.
Energetics Incorporated, "Cyber-Physical Systems: Situation Analysis of Current Trends, Technologies, and Challenges" (2012).
Dang T., et al. "State estimation and property-guided exploration for hybrid systems testing" International Conference Testing Software and Systems vol. 7641 pp. 152-167 2012.
Dang, T., et al. "Sensitive state-space exploration" Proc. of the 47th IEEE Conference on Decision and Control pp. 4049-4054 Dec. 2008.
David et al., "Statistical Model Checking for Stochastic Hybrid Systems", Hybrid Systems and Biology (HSB), (2012), pp. 122-136.
Deng, Y., et al. "Strong: A trajectory-based verification toolbox for hybrid systems" in Quantitative Evaluation of Systems Springer vol. 8054 pp. 165-168 2013.
Dokhanchi, A.; Zutshi, A.; Sriniva, R. T.; Sankaranarayanan, S. & Fainekos, G., Requirements driven falsification with coverage metrics, 12th International Conference on Embedded Software (EMSOFT), 2015.
Donze A. et al "Robust satisfaction of temporal logic over real-valued signals" in Formal Modelling and Analysis of Timed Systems Springer vol. 6246 2010.
Donze A. et al "Systematic simulation using sensitivity analysis" in Hybrid Systems: Computation and Control Springer vol. 4416 pp. 174-189 2007.
Donze, "Breach, A Toolbox for Verification and Parameter Synthesis of Hybrid Systems", Computer Aided Verification, LNCS 6174, (2010), pp. 167-170.
Eker J. et al. "Taming heterogeneity—the ptolemy approach" Proceedings of the IEEE vol. 91 No. 1 pp. 127-144 Jan. 2003.
Fainekos et al., "Robustness of Temporal Logic Specifications for Continuous-Time Signals", Theoretical Computer Science, 410(42), (2009), pp. 4262-4291.
Fainekos et al., "Verification of Automotive Control Applications Using S-TaLiRo", 2012 American Control Conference, (2012), pp. 3567-3572.
Fainekos G. E. et al "Temporal logic verification using simulation" Proceedings of the 4th International Conference on Formal Modelling and Analysis of Timed Systems vol. 4202 pp. 171-186 2006.
Fainekos G. et al. "Robustness of temporal logic specifications" in Formal Approaches to Testing and Runtime Verification Springer vol. 4262 pp. 178-192 2006.
Fainekos, "Robustness of Temporal Logic Specifications", PhD Thesis, Department of Computer and Information Science, University of Pennsylvania, (2008).
Frehse et al., "SpaceEx: Scalable Verification of Hybrid Systems," Computer Aided Verification, LNCS 6806, (2011), pp. 379-395.
Gelfand et al., "Simulated Annealing With Noisy or Imprecise Energy Measurements", Journal of Optimization Theory and Application, 62(1), (1989), pp. 49-62.
Girard A, et al "Verification using simulation" in Hybrid Systems: Computation and Control (HSCC) Springer vol. 3927 pp. 272-286 2006.
Grosu et al, "Monte Carlo Model Checking", Tools and Algorithms for the Construction and Analysis of Systems (TACAS), LNCS 3440, (2005), pp. 1-19.

(56) References Cited

OTHER PUBLICATIONS

Henzinger, T. A. et al. "What's decidable about hybrid automata" J. Comput. Syst. Sci. vol. 57 No. 1 pp. 94-124 1998.
Hinton et al., "PRISM: A Tool for Automatic Verification of Probabilistic Systems", Tools and Algorithms for the Construction and Analysis of Systems (TACAS), LNCS 3920, (2006), pp. 441-444.
Hoxha B, et al. "Using s-taliro on industrial size automotive models" Proc. of Applied Verification for Continuous and Hybrid Systems 2014.
Huang, Z. et al. "Computing bounded reach sets from sampled simulation traces" The 15th International Conference on Hybrid Systems: Computation and Control (HSCC 2012) 2012.
Huang, Z. et al. "Proofs from simulations and modular annotations" Proceedings of the 17th International Conference on Hybrid Systems: Computation and Control pp. 183-192 2014.
Jeannin, J.-B. et al. "A formally verified hybrid system for the next-generation airborne collision avoidance system" TACAS vol. 9035 pp. 21-36 2015.
Jin, X., et al. "Mining requirements from closed-loop control models" in Hybrid Systems: Computation and Control ACM Press 2013.
Julius A. A., et al. "Robust test generation and coverage for hybrid systems" in Hybrid Systems: Computation and Control Springer vol. 4416 pp. 329-342 2007.
Julius et al. Approximate abstraction of stochastic hybrid automata. In Hybrid Systems: Computation and Control, vol. 3927 of LNCS, pp. 318-332. Springer, 2006.
Julius et al. Probabilistic testing for stochastic hybrid systems. In 4 7th IEEE Conference on Decision and Control, 2008.
Julius, et al. Approximate bisimulation for a class of stochastic hybrid systems. In American Control Conference, 2006.
Kapinski J. et al. "Simulation-guided approaches for verification of automotive powertrain control systems" American Control Conference 2015.
Kong, Z. et al. "Temporal logic inference for classification and prediction from data" Proceedings of the 17th International Conference on Hybrid Systems: Computation and Control 2014.
Koymans, "Specifying Real-Time Properties With Metric Temporal Logic", Real-Time Systems, 2(4), (1990), pp. 255-299.
Lecchini et al., "Stochastic Optimization on Continuous Domains With Finite-Time Guarantees by Markov Chain Monte Carlo Methods", IEEE Transactions on Automatic Control, 55(12), (2010), pp. 2858-2863.
Lygeros, J. et al. "Dynamical properties of hybrid automata" IEEE Transactions on Automatic Control vol. 48 pp. 2-17 2003.
Maler, O. et al. "Monitoring temporal properties of continuous signals" Proceedings of FORMATS-FTRTFT vol. 3253 pp. 152-166 2004.
Muller. Simulation based optimal design. In B. J.O. J. M. Bernardo A. Dawid and S. A. F. M. editors Proc. 6th Valencia Int. Meeting on Bayesian Statistics pp. 459-474. Oxford 1999.
Nghiem T. et al. "Monte-carlo techniques for falsification of temporal properties of non-linear hybrid systems" Proceedings of the 13th ACM International Conference on Hybrid Systems: Computation and Control pp. 211-220 2010.
Plaku E. et al, "Falsification of ltl safety properties in hybrid systems" Proc. of the Conf. on Tools and Algorithms for the Construction and Analysis of Systems (TACAS) vol. 5505 pp. 368-382 2009.
Rizk et al., "Continuous Valuations of Temporal Logic Specifications With Applications to Parameter Optimization and Robustness Measures", Theoretical Computer Science, 412(26), (2011), pp. 2827-2839.
Sankaranarayanan et al., "Falsification of Temporal Properties of Hybrid Systems Using the Cross-Entropy Method," in Hybrid Systems Computation and Control (HSCC), (2012).
Sankaranarayanan et al., "State Space Exploration Using Feedback Constraint Generation and Monte-Carlo Sampling", European Software Engineering Conference and The Foundations of Software Engineering, (2007), pp. 321-330.
Seda A. K. et al, "Generalized distance functions in the theory of computation" The Computer Journal vol. 53 No. 4 pp. bxm108443-464 2008.
Simuquest. Enginuity. http://www.simuquest.com/products/enginuity. Accessed: Oct. 14, 2013.
Sproston, "Decidable Model Checking of Probabilistic Hybrid Automata", International School and Symposium on Formal Techniques in Real-Time and Fault-Tolerant Systems, LNCS 1926, (2000), pp. 31-45.
Srinivas et al., "Information-Theoretic Regret Bounds for Gaussian Process Optimization in the Bandit Setting", IEEE Transactions on Information Theory, 58(5), (2012), pp. 3250-3265.
Srinivasa, R. T. Instrumentation and Coverage Analysis of Cyber Physical System Models Arizona State University, 2016.
Taliro Tools [online] Available: https://sites.google.com/a/asu.edu/s-taliro/.—Accessed Apr. 2015.
Tkachev et al. Formula-free finite abstractions for linear temporal verification of stochastic hybrid systems. In Hybrid Systems: Computation and Control. ACl\1 Press, 2013.
Tripakis et al., "Modeling, Verification and Testing using Timed and Hybrid Automata", Model-Based Design for Embedded Systems, (2009), pp. 383-436.
Yang H. et al. Querying parametric temporal logic properties on embedded systems. In Testing Software and Systems pp. 136-151. Springer 2012.
Younes et al., "Probabilistic Verification of Discrete Event Systems Using Acceptance Sampling", International Conference Computer Aided Verification, LNCS 2404, (2002), pp. 223-235.
Zhao et al., "Generating Test Inputs for Embedded Control Systems", IEEE Control Systems Magazine, (2003), No. 49-57.
Zuliani et al., "Bayesian Statistical Model Checking With Application to Stateflow/Simulin Verification", Hybrid Systems Computation and Control (HSCC), (2010), pp. 243-252.
Zutshi A. et al. "Falsification of safety properties for closed loop control systems" Proceedings of the 18th International Conference on Hybrid Systems: Computation and Control pp. 299-300 2015.
Zutshi A. et al. "A trajectory splicing approach to concretizing counterexamples for hybrid systems" Decision and Control (CDC) 2013 IEEE 52nd Annual Conference on pp. 3918-3925 2013.
Zutshi A. et al. "Multiple shooting cegar-based falsification for hybrid systems" Proceedings of the 14th International Conference on Embedded Software pp. 5 2014.

\* cited by examiner

```
...
OutCon = In - 3;
if In <= 3
    state = 1;
else
    state = 2;
end
OutBr = state;
...
```

FIG. 8

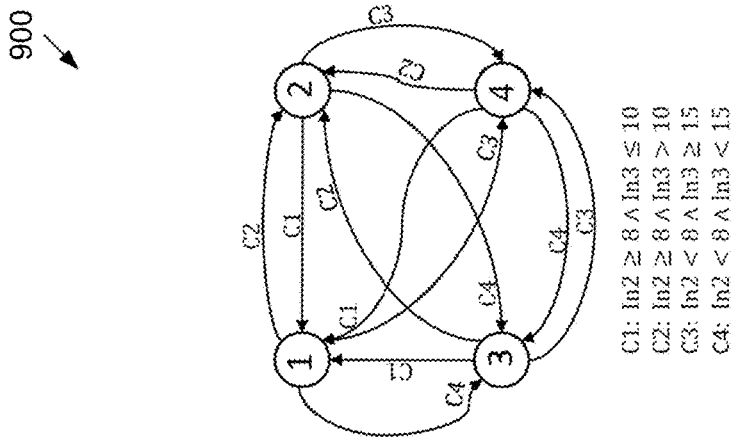
FIG. 9C
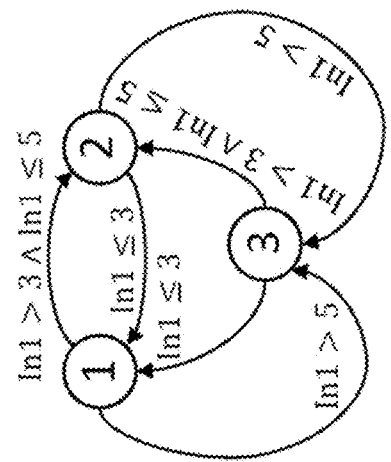
FIG. 9B
```
...
if In1 <= 3
    s1 = 1;
elseif In1 <= 5
    s1 = 2;
else
    s1 = 3;
end
...
if In2 >= 8
    if In3 <= 10
        s2 = 1;
    else
        s2 = 2;
    end
else
    if In3 >= 15
        s2 = 3;
    else
        s2 = 4;
    end
end
...
```
FIG. 9A

AUTOMATED TEST GENERATION FOR STRUCTURAL COVERAGE FOR TEMPORAL LOGIC FALSIFICATION OF CYBER-PHYSICAL SYSTEMS

CROSS-REFERENCE TO RELATED APPLICATIONS

This application claims priority to U.S. Provisional Patent Application 62/401,989, filed Sep. 30, 2016, the content of which is incorporated herein by reference in its entirety.

This application is related to U.S. patent application Ser. No. 15/034,979, filed May 6, 2016, entitled "TEMPORAL LOGIC ROBUSTNESS GUIDED TESTING FOR CYBER-PHYSICAL SYSTEMS."

STATEMENT REGARDING FEDERALLY SPONSORED RESEARCH

This invention was made with government support under contracts 1350420 and 1319560 awarded by the National Science Foundation, and contract A1.Y8.GF awarded by the Center for Embedded Systems. The government has certain rights in the invention.

FIELD OF THE DISCLOSURE

This disclosure relates to methods and apparatuses for verification of systems and models of systems, including hardware and software in system loops, and more particularly relates to automated test generation for structural coverage for temporal logic falsification of cyber-physical systems.

BACKGROUND

Stochasticity is inherent in many systems. It might arise as the result of actuator effects, sensor readings, rate of arrivals, component failure rates, etc. Even though testing is a commonly used approach to verify systems, it relies on the ability of the engineers to write out test cases that cover all the behaviors of the system where the expected failures can occur. That is usually a very difficult task. Furthermore, in many cases, system failures can occur in unexpected operating conditions and inputs.

The verification problem for stochastic or probabilistic hybrid systems has received much attention over the years. The focus of the early work was mainly on probabilistic reachability verification problems. Temporal logic model checking and verification problems for stochastic hybrid systems have also been researched for a long time, and this is still an active research area. However, many of these works are focused on building system abstractions that can be checked using existing verification tools.

One issue with falsification algorithms used in model verification schemes is determining the number of tests required to verify a model. The number of tests required to verify a model often depends on the robustness landscape over the search space of the hybrid system. The discontinuities induced by the hybrid system may make it hard to locate the regions of interest for testing purposes.

In the falsification problem, the search space consists of initial conditions, input signals and other system parameters. However, the algorithm performance, i.e., how many tests are required before a bad behavior is detected, depends on the landscape induced by the specification robustness over the search space of the hybrid system. In particular, these methods apply more effectively to continuous (non-hybrid) dynamical systems. Even though continuous systems may still have a large number of local minima, their basin of attraction is usually large. The latter fact helps algorithms to locate faster regions of interest in the search space.

However, the same does not hold for hybrid systems. Local minima can now appear anywhere in the search space with very small or non-smooth basins of attraction. Therefore, the probability that these regions will be detected becomes very small. In addition, gradient descent algorithms will not work in such cases. However, if a system can extract information about potential discontinuities in the hybrid system, then the system can narrow a search to such regions which otherwise would have been rather improbable to sample from.

SUMMARY OF THE INVENTION

Models of hybrid systems or, more generally, of Cyber Physical Systems (CPS) can be represented as models developed within a Model Based Development (MBD) language such as Ptolemy, LabVIEW, or Simulink/Stateflow. The models can be tested with respect to requirements (specifications) presented in Metric Temporal Logic (MTL) or Signal Temporal Logic (STL). The disclosed systems and methods can instrument MBD models or software in the loop in order to guide a falsification search toward promising regions. Coverage metrics can be defined, not on the continuous state space of the CPS, but on its components that introduce discontinuities. In this way, the stochastic algorithms can search over locally continuous spaces while implicitly guiding the search towards promising operating modes of the CPS. This is important because computing coverage for systems with many real-valued state variables can become an intractable task.

Methods and apparatuses for model verification include: obtaining, by a processor, a model for a system; identifying, by the processor, at least one block within the model that has a branching structure; identifying, by the processor, at least one model variable affecting a switching condition of the identified at least one block; generating, by the processor, an extended finite state machine modeling a switching behavior of the identified at least one block by using the at least one model variable; combining, by the processor, at least one output variable of the extended finite state machine with at least one of a first output port and a second output port of the system included in the model; and performing, by the processor, model verification and coverage of the model that utilizes outputs from the first output port and the second output port to verify the model. In some embodiments, the model can contain one or more of hardware in the loop or software in the loop components.

In some embodiments, performing coverage guided falsification includes: determining if a falsification process executed as part of the model verification process has terminated successfully or unsuccessfully; and modifying the model verification process to perform a coverage-guided falsification process in which preference is first given to combinations of modes of the model that were evaluated as part of the model verification process and had the lowest coverage statistics, for example a coverage statistic of zero, based on the collected coverage statistics, wherein performing a coverage-guided falsification process comprises minimizing a robustness of the model and guiding the model verification process to modes that had the lowest coverage statistics, for example a coverage statistic of zero.

Methods and apparatuses for code verification include: obtaining, by a processor, embedded code; identifying, by the processor, at least one block within the embedded code that has a branching structure; generating, by the processor, a first output variable based on an extracted extended finite state machine for the identified at least one block; combining, by the processor, the first output variable generated based on the extracted extended finite state machine with at least a second output variable of the system included in the embedded code; and performing, by the processor, verification and coverage of the embedded code that utilizes the first and second output variable to verify the embedded code.

The foregoing has outlined rather broadly the features and technical advantages of the present disclosure in order that the detailed description that follows may be better understood. Additional features and advantages of the disclosed embodiments will be described hereinafter that form the subject of the claims of the disclosure. It should be appreciated by those skilled in the art that the conception and specific embodiments disclosed may be readily utilized as a basis for modifying or designing other structures for carrying out the same purposes of the present disclosed embodiments. It should also be realized by those skilled in the art that such equivalent constructions do not depart from the spirit and scope of the disclosed embodiments as set forth in the appended claims. The novel features that are believed to be characteristic of the disclosed embodiments, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosed embodiments.

The terms "a" and "an" are defined as one or more unless this disclosure explicitly requires otherwise. The term "substantially" is defined as largely but not necessarily wholly what is specified (and includes what is specified; e.g., substantially 90 degrees includes 90 degrees and substantially parallel includes parallel), as understood by a person of ordinary skill in the art. In any disclosed embodiment, the terms "substantially," "approximately," and "about" may be substituted with "within [a percentage] of" what is specified, where the percentage includes 0.1, 1, 5, and 10 percent.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, or a component of a system, that "comprises," "has," "includes" or "contains" one or more elements or features possesses those one or more elements or features, but is not limited to possessing only those elements or features. Likewise, a method that "comprises," "has," "includes" or "contains" one or more steps possesses those one or more steps, but is not limited to possessing only those one or more steps. Additionally, terms such as "first" and "second" are used only to differentiate structures or features, and not to limit the different structures or features to a particular order.

Any embodiment of any of the disclosed methods, systems, system components, or method steps can consist of or consist essentially of—rather than comprise/include/contain/have—any of the described elements, steps, and/or features. Thus, in any of the claims, the term "consisting of" or "consisting essentially of" can be substituted for any of the open-ended linking verbs recited above, in order to change the scope of a given claim from what it would otherwise be using the open-ended linking verb.

The feature or features of one embodiment may be applied to other embodiments, even though not described or illustrated, unless expressly prohibited by this disclosure or the nature of the embodiments.

BRIEF DESCRIPTION OF THE DRAWINGS

The following drawings form part of the present specification and are included to further demonstrate certain aspects of the present disclosure. The disclosure may be better understood by reference to one or more of these drawings in combination with the detailed description of specific embodiments.

FIG. 8 is an instrumented exemplary code block of the code block shown in FIG. 7A according to an embodiment of the disclosure.

FIGS. 9A-C are exemplary sequential code blocks and corresponding state diagrams of Extended State Machines (ESM) of the exemplary MBD model of FIGS. 7A-8 according to an embodiment of the disclosure.

DETAILED DESCRIPTION

Embodiments of this disclosure may provide an automated framework for analyzing and extracting information about the blocks that introduce nonlinearities, e.g., switch and saturation blocks and embedded MATLAB code in MBD models such as Simulink models. Embodiments of this disclosure may also perform test generation for coverage analysis of these blocks with an existing specification guided testing framework, for example, S-TaLiRo. In particular, some embodiments of this disclosure improve the performance of formal requirements guided automatic test generation methods for CPS. The goal of requirements guided test generation is to detect system behaviors that do not satisfy the requirements. This process is usually referred to as falsification. The Cyber-Physical Systems under Test (CPSUT) includes mathematical models of CPS as well as hardware- and processor-in-the-loop CPS. Some embodiments of this disclosure instrument models and code of CPS and extracts information on the potential discontinuities in the CPS. Hence, embodiments of this disclosure can narrow the search to regions in the search space which otherwise would have been improbable to sample from. In addition, as a byproduct of the falsification process, embodiments of this disclosure can track and compute coverage metrics on the structure of the model or the code of the CPS. Without the new guidance method, many falsification problems are impossible to solve within a practical amount of time. It is expected that the new guidance method will both improve the falsification process and increase the level of confidence in the testing process due to the collection of coverage based metrics.

Figure 1:
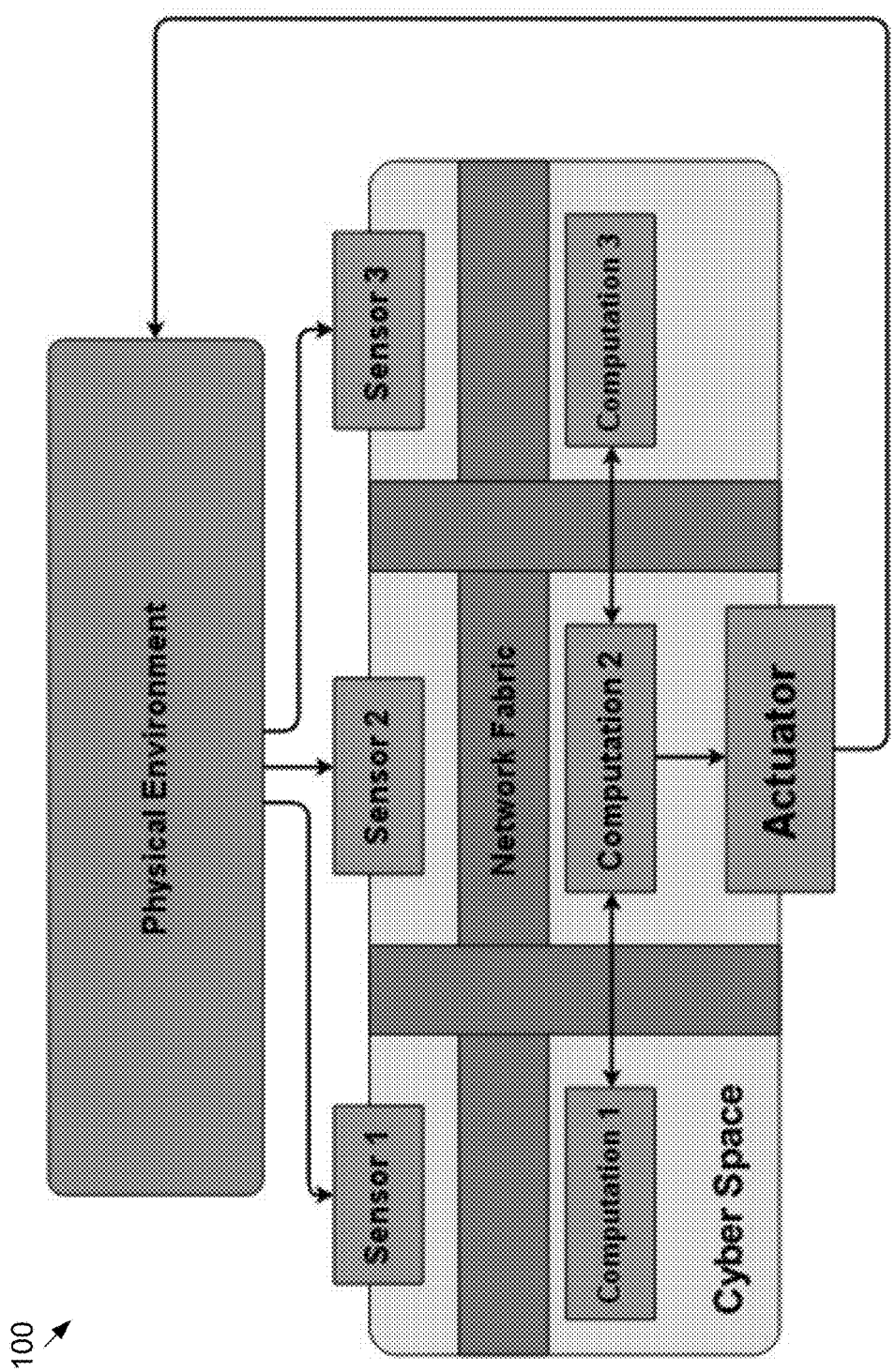
FIG. 1 is a schematic block diagram illustrating an exemplary architecture of a CPS according to an embodiment of the disclosure.

A CPS may include a computer monitoring and controlling physical processes, usually in a feedback loop. For example, as shown in FIG. 1, a typical CPS 100 may include a physical plant that constitutes the physical environment part of the system as well as the mechanical parts or human operators. A CPS may also include a computation platform that includes computers, sensors, and actuators that monitor the physical environment and accordingly implement a control law that determines actions to be issued to actuators. A CPS may also include a network fabric that enables communication between computers in the CPS.

These systems are increasingly becoming part of our daily life ranging from smart buildings to medical devices to automobiles. The controller may include discrete software which may be operating in one of many possible operating modes and interacting with a changing physical environment in a feedback loop. Systems with such a mix of discrete and continuous dynamics are usually termed hybrid systems. These systems may be safety critical and have hard real-time constraints, requiring that their correct operation be extensively verified.

Model Based Design (MBD) languages like Simulink are being used extensively for the design and analysis of hybrid systems due to the ease in system design and automatic code generation. MBD also allows testing and verification of these systems before deployment. One of the main challenges in the verification of these systems is to test all the operating modes of the control software and reduce the amount of user intervention.

Specification robustness guided falsification is one scheme that may be used to verify a model. In specification robustness guided falsification, tests for the model may be carefully chosen and executed to violate a formal specification by searching for system behaviors that violate a formal specification (requirement) and executing a number of carefully selected tests. Robustness semantics may evaluate to positive values if a test trajectory satisfies the specification and negative if it violates the specification. In other words, robustness may be viewed as a measure of how well the behavior satisfies or violates the specification. A falsification algorithm essentially tries to generate tests that result in negative robustness values through the application of stochastic or deterministic optimization algorithms.

One issue with falsification algorithms is determining the number of tests required to verify a model. The number of tests required to verify a model often depends on the robustness landscape over the search space of the CPS. The discontinuities induced by the CPS may make it hard to locate the regions of interest for testing purposes.

According to one embodiment of this disclosure, information about potential discontinuities in the CPS may be extracted and used to narrow the search to such regions that are hard to locate in typical verification schemes. In particular, discontinuities induced in CPS models in the form of nonlinear blocks may be analyzed and extracted to update the system models and to improve the verification of the system models. According to one embodiment, an automated system may be developed to identify the nonlinear components and extract their behavior in the form of state transition graphs. In another embodiment, the system may be integrated with a model verification scheme that searches for a system trajectory that minimizes the robustness value of the specification, such as the S-TaLiRo model verification system available from Arizona State University, to improve the model verification performance. In some embodiments, the model verification scheme may perform mode coverage and provide a platform for coverage-based falsification.

Embodiments of this disclosure exhibit many advantageous features. For example, embodiments show how to instrument Simulink/Stateflow models in order to guide the falsification search toward promising regions. Second, embodiments define coverage metrics not on the continuous state space of the CPS, but on its components that introduce discontinuities. In this way, the stochastic algorithms search over locally continuous spaces while the search is implicitly guided towards promising operating modes of the CPS. This is important because computing coverage for systems with many real-valued state variables becomes an intractable task. Furthermore, our methods may still be utilized in testing actual implementations or testing models which contain black-box components. Third, the instrumented models and the new coverage metrics may be used to guide the search process in order to search for falsifying system behaviors. Theoretically, the search process is guaranteed to eventually detect system errors as long as these are not of measure zero in the search space.

For the purposes of the disclosed embodiments, it can be assumed that $\mathbb{R}$ is the set of real numbers, $\mathbb{R}_+$ is the set of non-negative real numbers, and $\overline{\mathbb{R}} = \mathbb{R} \cup \{\pm\infty\}$. Also, $\mathbb{Z}$ is the set of natural numbers including 0 and $\mathbb{Z}$ the integers. Given two sets A and B, $B^A$ is the set of all functions from A to B, i.e., for any $f \in B^A$ there is $f: A \to B$. $p(A)$ can be defined to be the power set of the set A and $T \in \mathbb{R}_+$ can be fixed to be the maximum simulation time.

Formally, a system $\Sigma$ can be viewed as a mapping from initial conditions $x_0$, system parameters P and input signals $U^R$ to output signals $Y^R$. Here, R represents an abstract time domain. For example, $R = \mathbb{Z} \times \mathbb{R}$ when referring to solutions to trajectories of a CPS but it can be assumed that R=[0, T]. In the following, [0, T] can be thought as the dense physical time domain for the testing or the simulation. Also, U is the set of input values (input space) and Y is the set of output values (output space).

The following three condition of the system can be critical in order to be algorithmically searchable over an infinite space: 1) The input signals $u \in U^{0,T}$ (if any) can be piecewise and continuously defined over a finite number of intervals over [0, T]. This assumption can enable the parameterization of the input signal space over a finite set of parameters. Thus, in the following it can be assumed that any $u \in U^{0,T}$ of interest can be represented by a vector of parameter variables p taking values from a set $P_U$. 2) The output space Y can be equipped with a nontrivial metric. For example, the discrete metric may not provide any useful quantitative information. 3) The system $\Sigma$ can be deterministic. That is, for a specific initial condition $x_0$ and input signal u, there can exist a unique output signal y.

The above conditions can render the system $\Sigma$ to be a function $\Delta_\Sigma: X_0 \times P \times P_U \to Y^{[0,T]}$ which takes as input an initial condition vector $x_0 \in X_0$ and two parameter vectors $p \in P$ and $\dot{p} \in P_U$, and produces as output a signal $y: [0, T] \to Y$. It can be assumed that there exists a sampling function $\tau: \mathbb{Z} \to [0, T]$ that returns for each sample i its time stamp $\tau(i)$. In practice, $\tau$ is a partial function $\tau: \mathbb{Z} \to [0, T]$ with $N \subset \mathbb{Z}$ and $|N| < \infty$. A timed state sequence or trace is the pair $\mu = (y \circ \tau, \tau)$ and $y \circ \tau$ can be denoted by $\dot{y}$. The set of all timed state sequences of $\Sigma$ that correspond to any sampling function $\tau$ can be denoted by $\mathcal{L}(\Sigma)$. That is, $\mathcal{L}(\Sigma) = \{(y \circ \tau, \tau) \exists \in [0, T]^N \cdot \exists x_0 \in X_0 \cdot \exists p \in P \cdot \exists \dot{p} \in P_U \cdot y = \Delta_\Sigma(x_0, p, \dot{p})\}$. It can be assumed that the output space Y of the system $\Sigma$ comprises of the original output space $Y_\Sigma$ of the system (equipped with the nontrivial metric), an auxiliary output space $Y_A$ (which for now can be left undefined), and a finite space $Y_F$. That is, $Y = Y_\Sigma \times Y_A \times Y_F$. The output space $Y_F$ plays an important role since it captures the state of important components in the system. For example, it can capture the state of switch blocks in state diagrams or the state of state diagram machines. Thus, the coverage metrics can be defined as simply set coverage metrics over the space $Y_F$ or more generally as coverage of sequences of symbols from $Y^*_F$. The disclosed embodiments focus on the former coverage criterion.

In the disclosed embodiments, a goal is to use coverage metrics to guide the search towards less visited states or logical conditions. When dealing with industrial size models, it is unrealistic to assume that there is going to be a single state diagram or that it is going to be efficient to flatten all the different state diagrams into one. Thus, for the purposes of this disclosure, the model verification system can be expanded to handle multiple finite state components. The metric can be extended in a natural way using the maximum pairwise hybrid distance. Namely, when $Y = \mathbb{R}^n \times Q_1 \times \ldots \times Q_m$, where $Q_1, \ldots, Q_m$ are the sets of states of m state diagrams, the following metric can be used:

$$d_h^{max}(\langle x, q_1, \ldots, q_m \rangle, \langle x', q'_1, \ldots, q'_m \rangle) = \max\{d_h(\langle x, q_1 \rangle, \langle x', q'_1 \rangle), \ldots, d_h(\langle x, q_m \rangle, \langle x', q'_m \rangle).\}$$

In the disclosed embodiments, the model can be instrumented under test to expose additional real-valued signals to the testing algorithm. These signals can become part of the auxiliary output space $Y_A$. For the purposes of computing the distance metric, the output spaces $Y_\Sigma$ and $Y_A$ can be treated as a Euclidean metric space. That is, in $d_h^{max}$ it can be assumed that $Y_\Sigma \times Y_A = \mathbb{R}^n$. Therefore, $Y_F = Q_1 \times \ldots \times Q_m$.

In the disclosed embodiments, a search/optimization algorithm proposes initial conditions, parameters and input signals. Then, the simulator or hardware in the loop system produces the system behavior over which the specification robustness is evaluated. The process is repeated until a maximum number of test/simulations is reached or a falsifying behavior is detected. Based on this framework, a model verification scheme, such as the S-TaLiRo model verification system, can be given a system and its specification and can search for a system trajectory that minimizes the robustness value of the specification.

These systems can achieve faster falsification with respect to the number of tests/simulations and can provide coverage guarantees after the falsification algorithm has concluded. In other words, if a falsification algorithm could not provide a falsifying witness, at least it will be able to list every "mode" of the system that was accessed and, potentially, for how long. The latter is especially important in a CPS since falsifying trajectories can very well depend on the sequence of "modes" as well as the time the system remained in each mode.

In this section, the basic steps of the disclosed coverage guided specification falsification framework are discussed. In the following, the finite system states can be referred to as modes to differentiate them from the continuous infinite state variables of the system.

In case no mode information or multiple modes are dictated for some atomic propositions, the falsification algorithm starts with the default search algorithm without any coverage guidance. As the search process evolves, coverage statistics are collected for the output space $Y_f$. Some of the proposed coverage metrics are: 1) Number of unique occurrences[1] of each mode $q_i \in Q_i$ for each state diagram $Q_i$. 2) Percentage of test time (samples) that the system remained in each mode $q_i \in Q_i$ for each state diagram $Q_i$. 3) Number of unique occurrences of each combination of modes $\langle q_1, \ldots, q_m \rangle$ of the state diagrams. 4) Percentage of test time (samples) that the system remained in each combination of modes $\langle q_1, \ldots, q_m \rangle$ of the state diagrams.

[1] I.e., consecutive repetitions of the same mode are ignored.

Since these are all heuristic metrics, more options are possible especially when considering sequences of modes. Another point which will need to be experimentally studied in the future is whether to collect such statistics over all test cases or the test cases with smallest robustness value found. If the falsification process terminates successfully, then the coverage information can also be returned to the user. If the falsification process fails, then the search algorithm switches to the coverage guided search. In coverage guided search, preference is first given to combinations of modes with the least coverage values.

Figure 2:
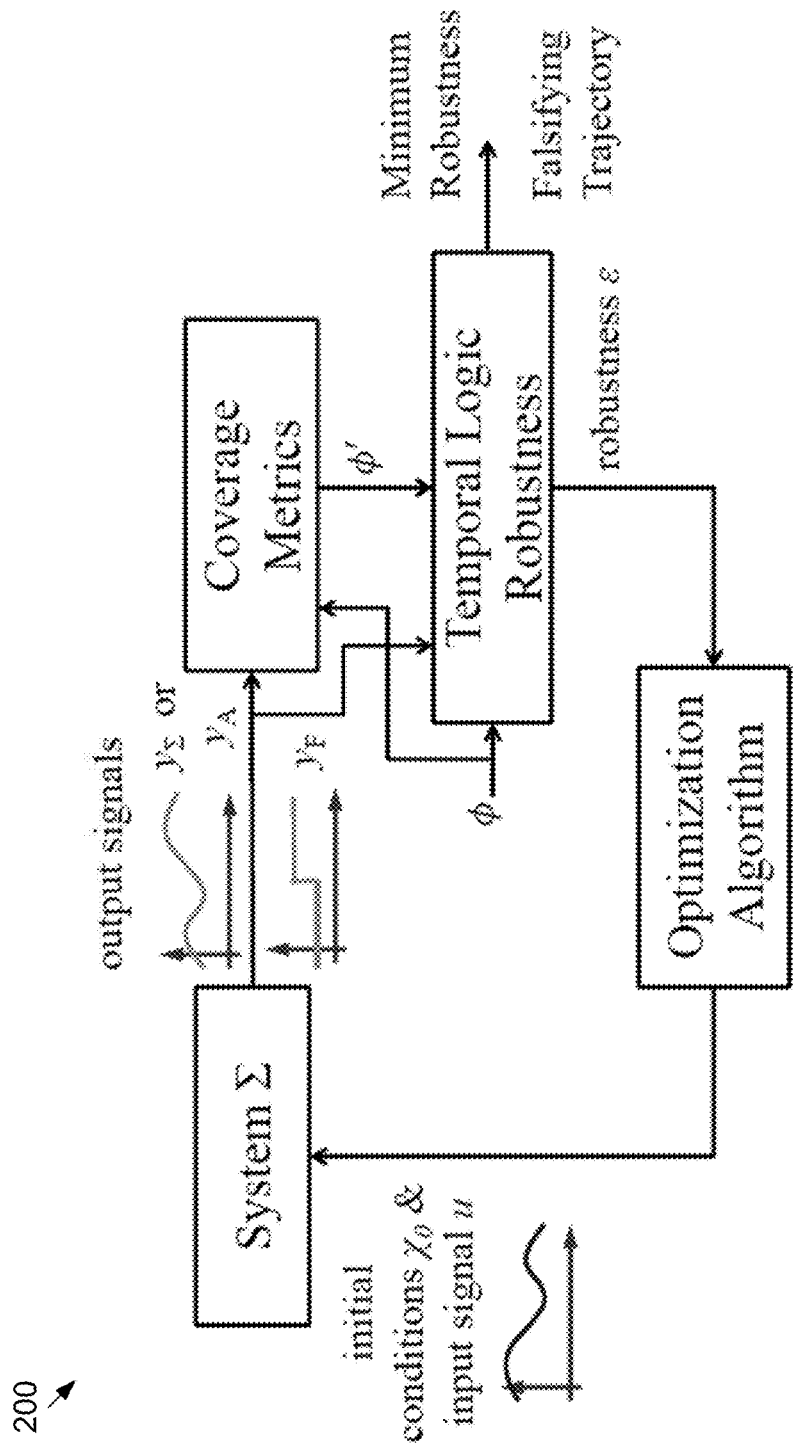
FIG. 2 is a block diagram illustrating an overview of the basic components of a coverage guided falsification framework according to an embodiment of the disclosure.

Due to the complexity of the systems that are considered, in general, it is not possible to know whether a specific combination of modes is reachable. Clearly, it is also not possible, in general, to compute initial conditions and parameters that would make a specific combination of modes reachable. Therefore, the specification can be modified to bias the search towards the desired combination of modes while still trying to falsify the original specification. In particular, if the original specification is φ and the least visited (or not visited at all) set of combinations of modes is $Q_{Des} \subseteq Q_1 \times \ldots \times Q_m$, then there can be defined a new atomic proposition $p_{Des}$ with $O(P_{Des})=\mathbb{R} \times Q_{Des}$ and a new MTL formula $\varphi'=\varphi \vee \neg \Diamond (p_{Des})$ can be created. The formula $\varphi'$ now becomes the target for the falsification process. Hence, now, the falsification algorithm while it tries to minimize the robustness, it indirectly pushes the system to go to the modes provided by the atomic proposition $P_{Des}$ since its robustness will be minimized as well. The basic architecture 200 of the coverage guided falsification algorithm is presented in FIG. 2.

Figure 3:
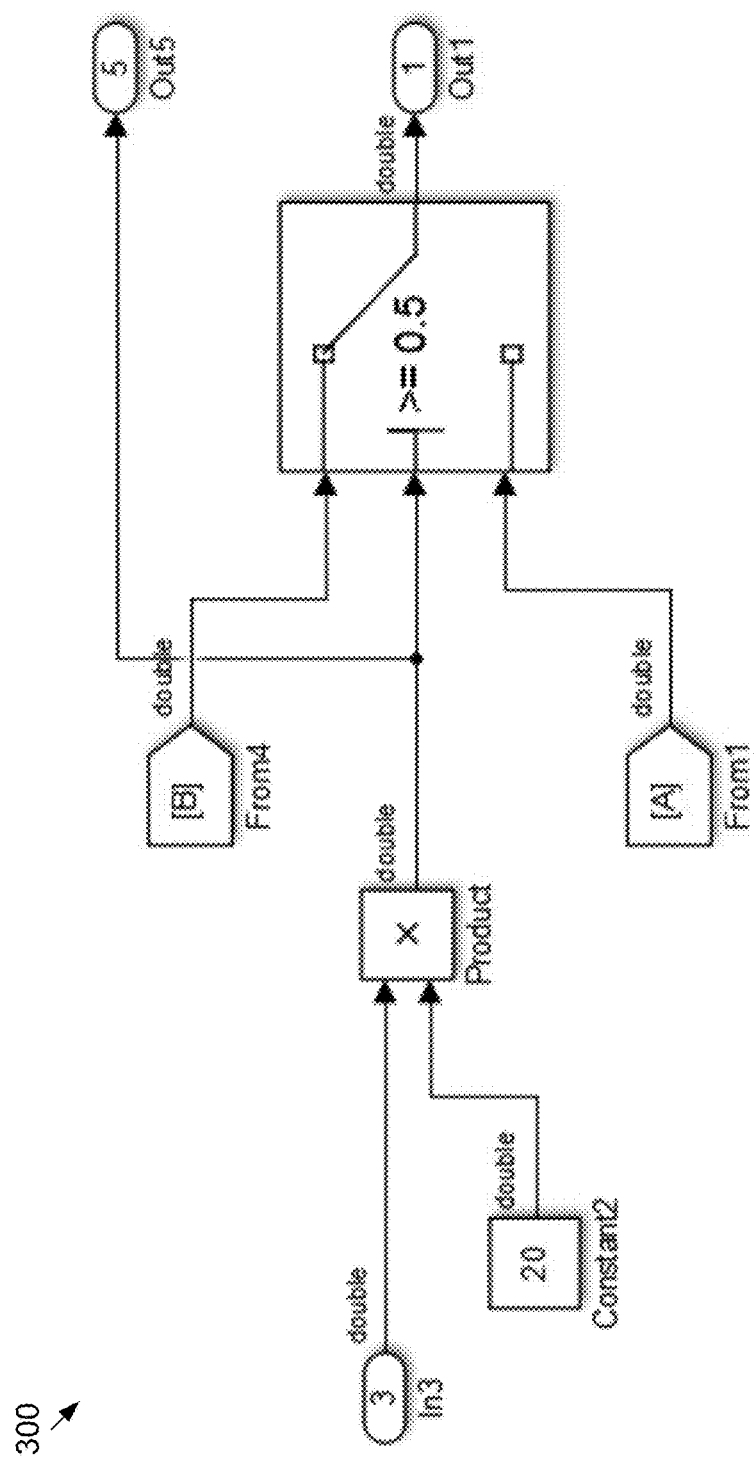
FIG. 3 is a schematic block diagram illustrating a first case of a switch block of an exemplary MBD model according to an embodiment of the disclosure.
Figure 4:
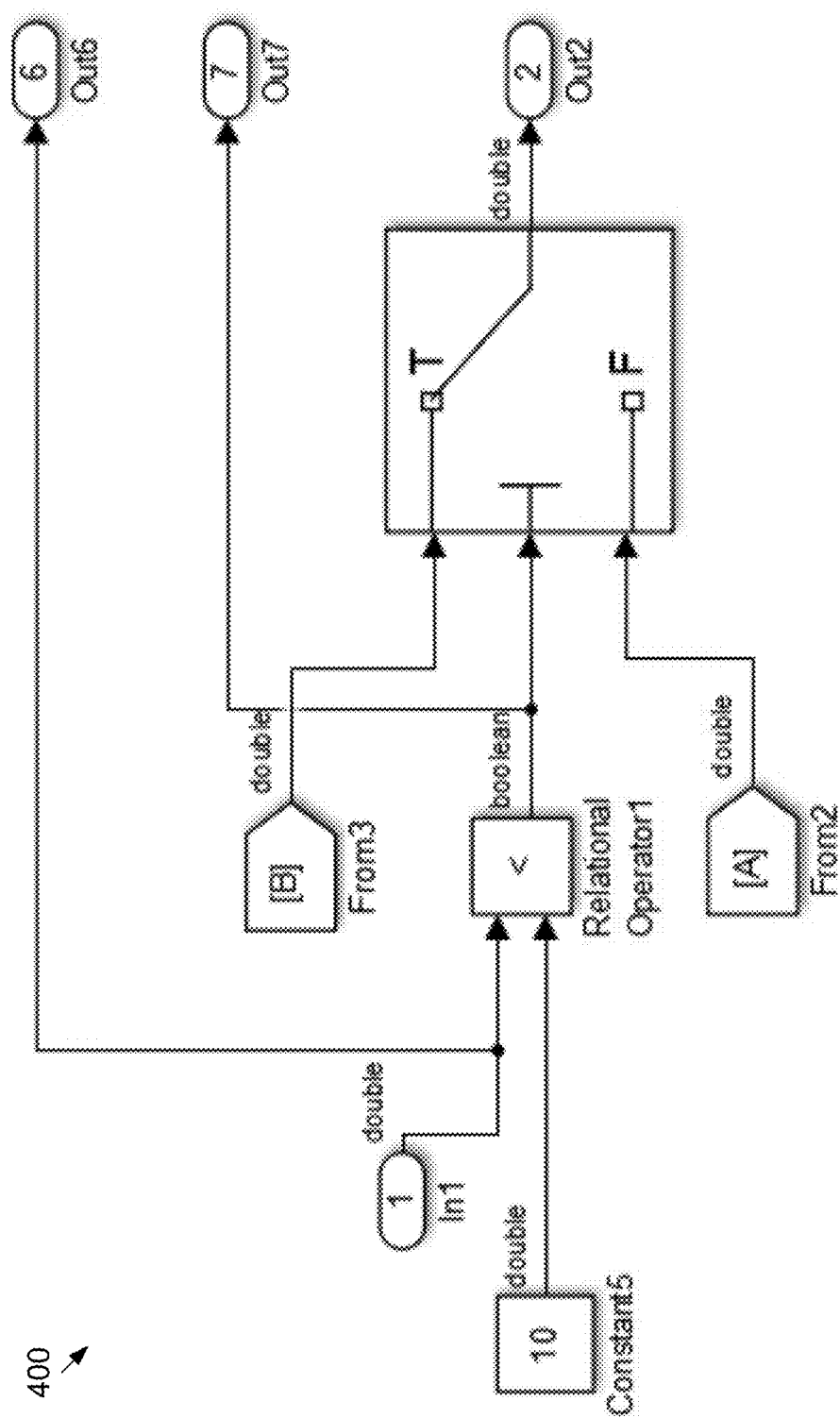
FIG. 4 is a schematic block diagram illustrating a second case of a switch block of an exemplary MBD model according to an embodiment of the disclosure.
Figure 5:
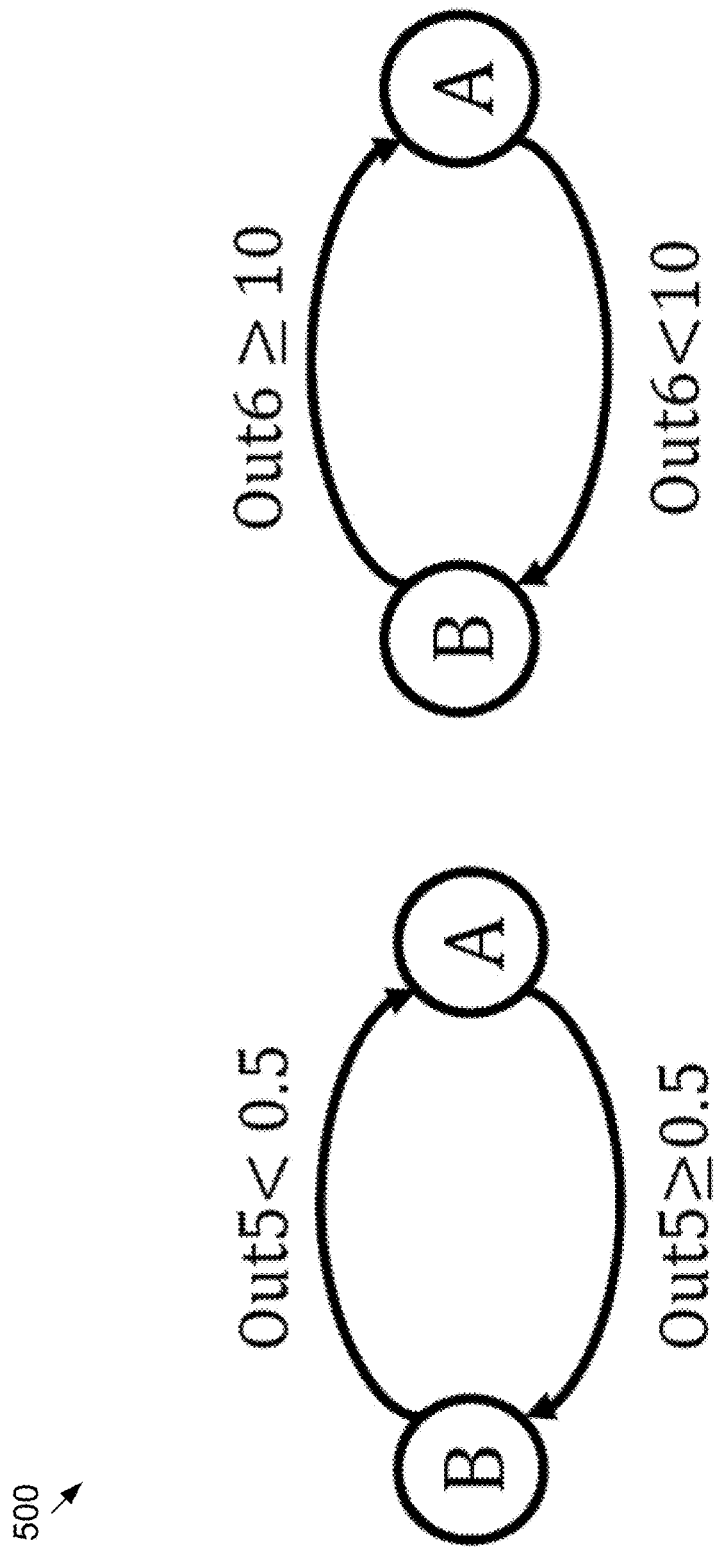
FIGS. 5A-B are state diagrams illustrating the switch block cases shown in FIG. 3 and FIG. 4, respectively, according to an embodiment of the disclosure.

The coverage guided falsification algorithm can be implemented by a model verification system for MBD models such as Simulink/Stateflow models. An important component of this process is the instrumentation of the models in order to handle automatically industrial size models. In a model instrumentation, an MBD model is analyzed and information is collected about blocks that introduce nonlinearities in a model. For instance, targets for instrumentation are switch blocks, absolute value blocks, saturation blocks, lookup tables, embedded code, and other suitable structures. Two cases of interest for switch blocks 300, 400, are presented in FIG. 3 and FIG. 4, respectively. In both cases, the switch block chooses either signal A or signal B based on the switching condition provided in the middle port. Each such switch can be modeled using a two-state state diagram (Extended Finite State Machine (EFSM)) 500 with transition guards representing the switching conditions of the blocks, as shown in FIGS. 5A-B (modeling FIG. 3 and FIG. 4, respectively).

The instrumentation algorithm analyzes locally the switch blocks and introduces output ports that become elements in the output spaces $Y_A$ and $Y_F$. In particular, referring to the switch in FIG. 3, Out1 is part of the output space $Y_\Sigma$. Through the instrumentation, the output port Out5 is introduced to the set $Y_A$. Moreover, in an outer harness for the model, it is computed whether the EFSM is in state A or B and this value becomes an element in the output set $Y_F$. The information that corresponds to the EFSM in FIG. 5A is also automatically extracted and utilized in the computation of the distance metric $d_h^{max}$. The instrumentation for the case of the switch in FIG. 4 is similar. In this case, out 2 is part of the output space $Y_\Sigma$. The instrumentation introduces out 6 and out 7 as elements of the sets $Y_A$ and $Y_F$, respectively. The output port Out7 captures the state of the switch, while the value in the output port out 6 along with the state diagram shown in FIG. 5B is needed for computing the distance metric $d_h^{max}$.

In the previous examples, any computed coverage information can directly correspond to state coverage for the switch block. In other words, condition coverage can be identical to mode coverage. However, in many cases, a Boolean input signal to the middle port of a switch block may be the output of a black box or white box Boolean circuit. In the former case, condition coverage in the relational operator blocks can be used as shown in FIG. 4. In the latter case, a satisfiability problem can be solved in order to directly control the state of the switch block. The MBD model instrumentation can performed automatically by a model verification system for a few commonly occurring blocks. The instrumentation function recursively instruments any subsystems unless they are masked linked systems. However, users of the system can also manually instrument any block.

Figure 6:
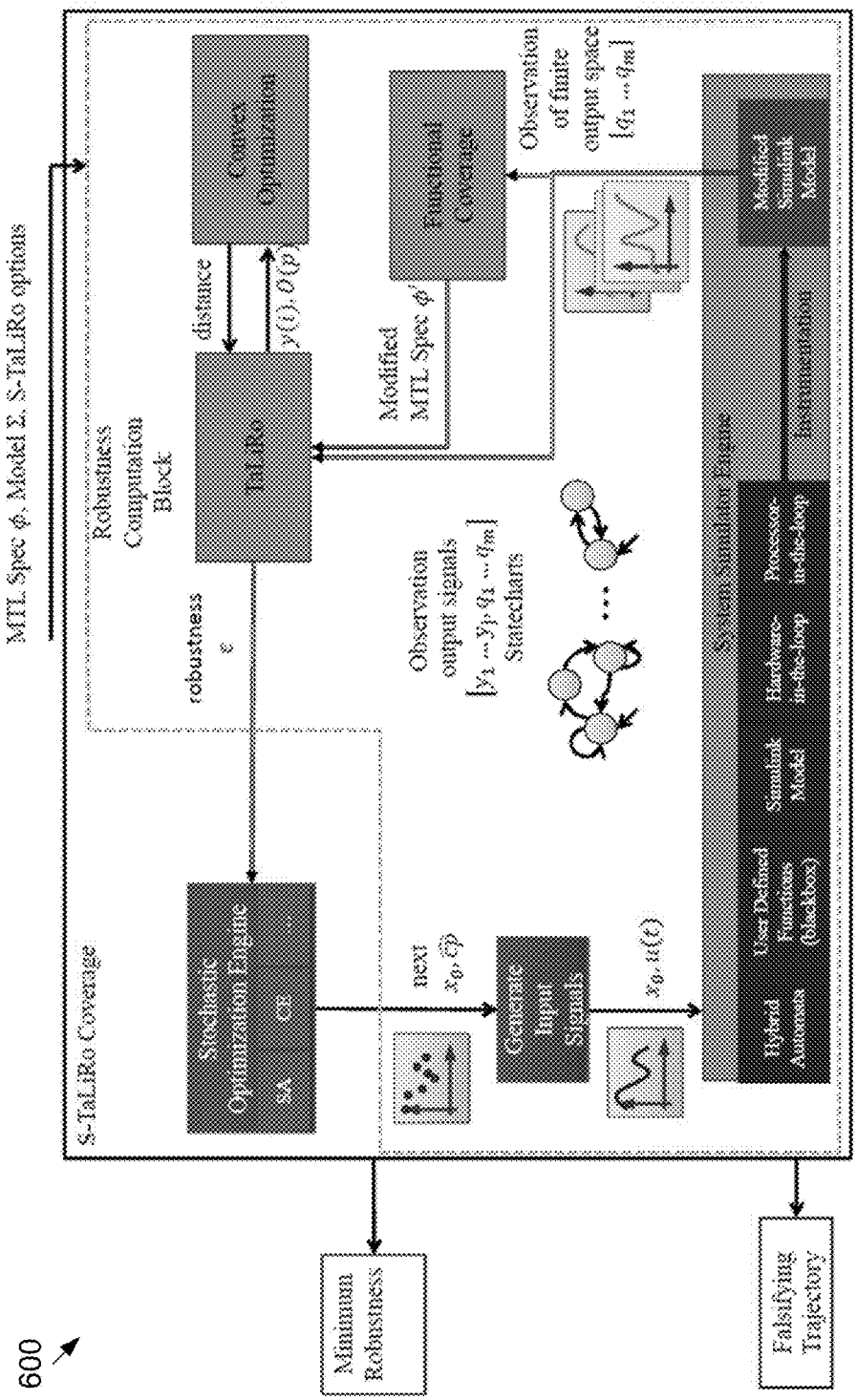
FIG. 6 is a schematic block diagram illustrating an exemplary architecture of an exemplary coverage guided falsification execution system according to an embodiment of the disclosure.

FIG. 6 provides an overview of the modular architecture 600 of the model verification system along with the data flow among the different components. The user can input the MBD model, the specification, and a command to execute coverage guided falsification. The internal components are transparent to the user unless the user would like to manually instrument the model or parts of the model. Among the options provided to the user for coverage guided falsification are: 1) The number of MTL or STL formula updates. 2) The number of tests/simulations before the MTL or STL formula is updated. 3) The coverage metric utilized. 4) Whether all the tests/simulations are utilized in the computation of the coverage metrics. 5) Whether in a formula update the next mode combination is chosen randomly or in some other order.

In the disclosed embodiments, the results of model coverage for MBD models can be transferred to code coverage for embedded code such as MATLAB code. When a MATLAB embedded code block contains If-Then-Else branches, this leads to another type of discrete behavior in a MBD model. The disclosed automatic test case generation framework primarily applies to If-Then-Else blocks where the If condition is a predicate on real-valued variables and inequality relational operators. When there exists an If-Then-Else block in the code, the MBD model can exhibit a discrete behavior based on whether the branch is taken or not taken.

Figures 7A, 7B:
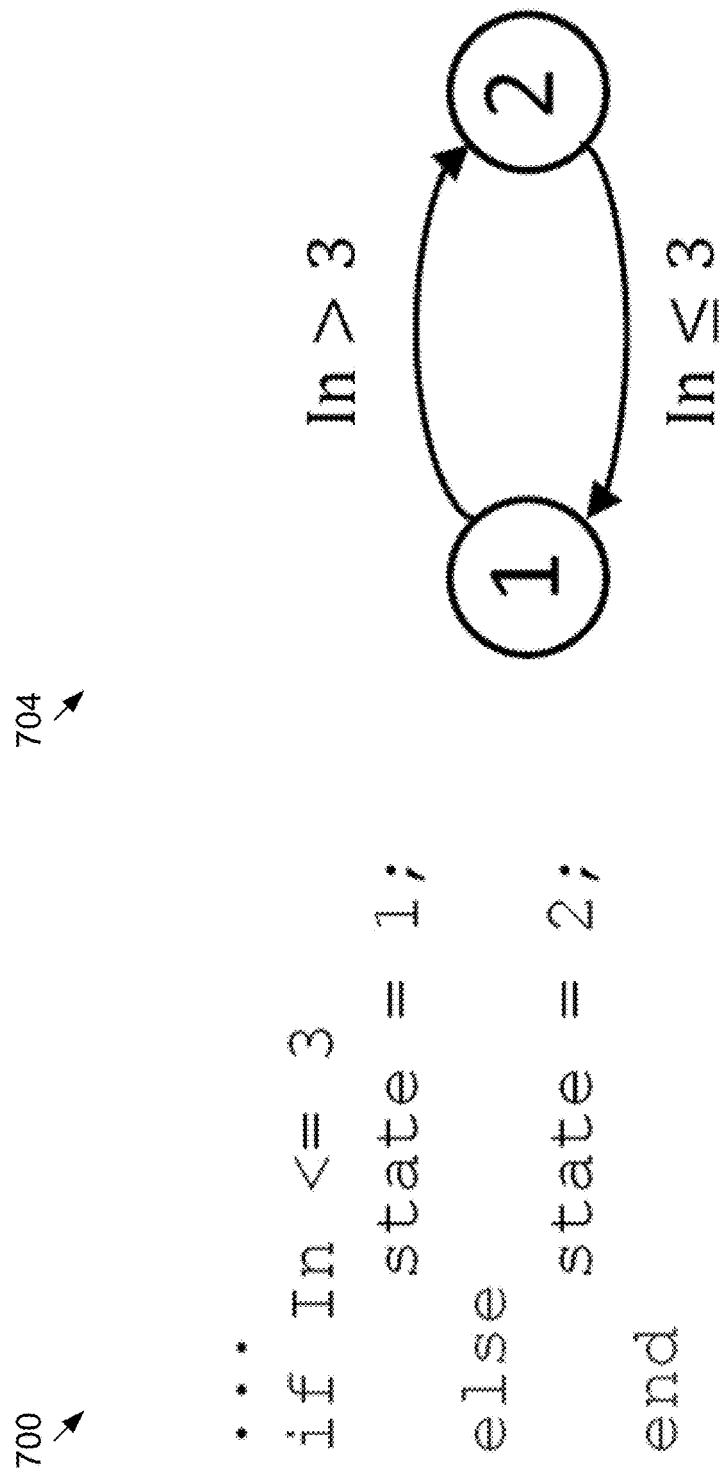
FIGS. 7A-B are an exemplary code block and corresponding state diagram, respectively, of an exemplary MBD model according to an embodiment of the disclosure.

Referring to FIGS. 7A-B, the If-Then-Else block 700 behaves as an EFSM 704 with two states with the corresponding transition guards. In order to annotate and instrument this If-Then-Else block, two outputs can be created, as shown in the block 800 shown in FIG. 8. The output port OutCon can return the distance of the conditional statement In<=3 from switching between True and False. The output port OutBr can indicate the current branch of the If-Then-Else block. The output port OutCon belongs to the set $Y_A$, and OutBr belongs to the set $Y_F$, discussed previously.

The implementation of the MATLAB code instrumentation can count the number of EFSM in the code. This involves parsing the code and finding the code lines that contain If-Then-Else keywords such as if, elseif, else, end. If the MATLAB code contains non-nested If-Then-Else blocks, then independent EFSM are created. On the other hand, when the branches are nested, then the number of states increases. As a result, the EFSM will have more than two states. This case 900 is shown in FIGS. 9A-C where the EFSM in FIG. 9B contains 3 states and the EFSM in FIG. 9C contains 4 states. A condition transition guard is created which leads to each state using the previous condition in a Boolean formula. The Boolean formula can be in Disjunctive Normal Form (DNF). DNF for Boolean formulas is used since EFSM transition guards in model verification system can be represented as the Union of Intersections of half-spaces. For DNF, first, a Boolean formula is translated into Negation Normal Form (NNF). Then, iteratively a∧(b∨c) is transformed into (a∧b)∨(a∧c) until no disjunction (∨) remains as a subformula of a conjunction (∧). After the instrumentation of the MATLAB embedded code is completed, the automatic test case generation framework disclosed previously can be applied directly to the system. This same process can apply to code in any other programming language (i.e., C, JAVA, Python, etc.) as long as the conditionals in If-Then-Else statements are expressions over numerical quantities.

Figure 10:
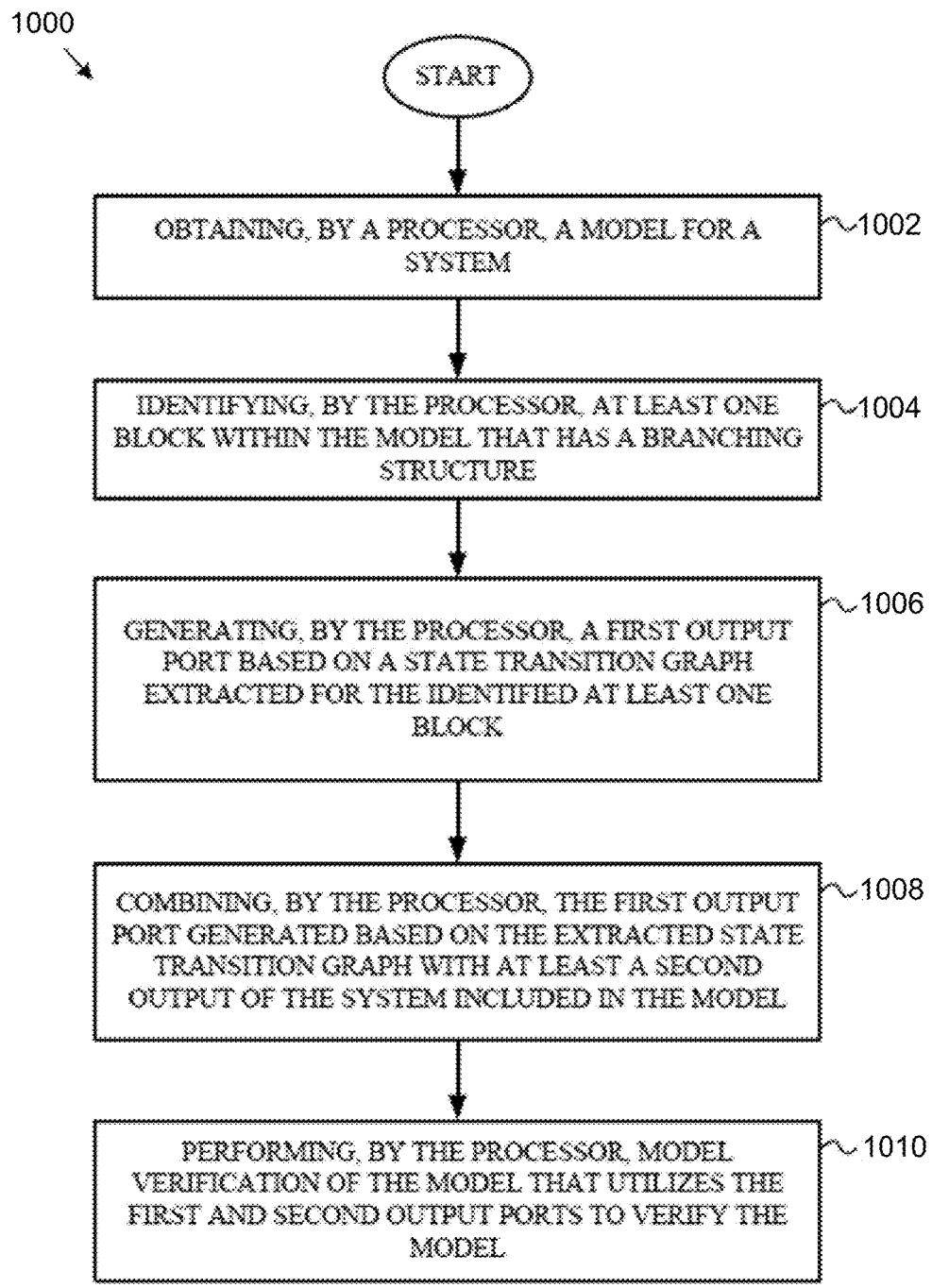
FIG. 10 is a schematic block diagram illustrating an exemplary model-based design process with model verification according to an embodiment of the disclosure.

FIG. 10 is a schematic block diagram 1000 illustrating a model-based design process with model verification according to an embodiment of the disclosure. Initially, at block 1002, a model for a system and at least one specification may be obtained. At block 1004, the method may include the step of identifying, by the processor, at least one block within the model that has a branching structure. At block 1006, the method may include the step of generating, by the processor, a first output port based on a state transition graph extracted for the identified at least one block. At block 1008, the method may include the step of combining, by the processor, the first output port generated based on the extracted state transition graph with at least a second output of the system included in the model. At block 1010, the method may include the step of performing, by the processor, model verification of the model that utilizes the first and second output ports to verify the model.

Figure 11:
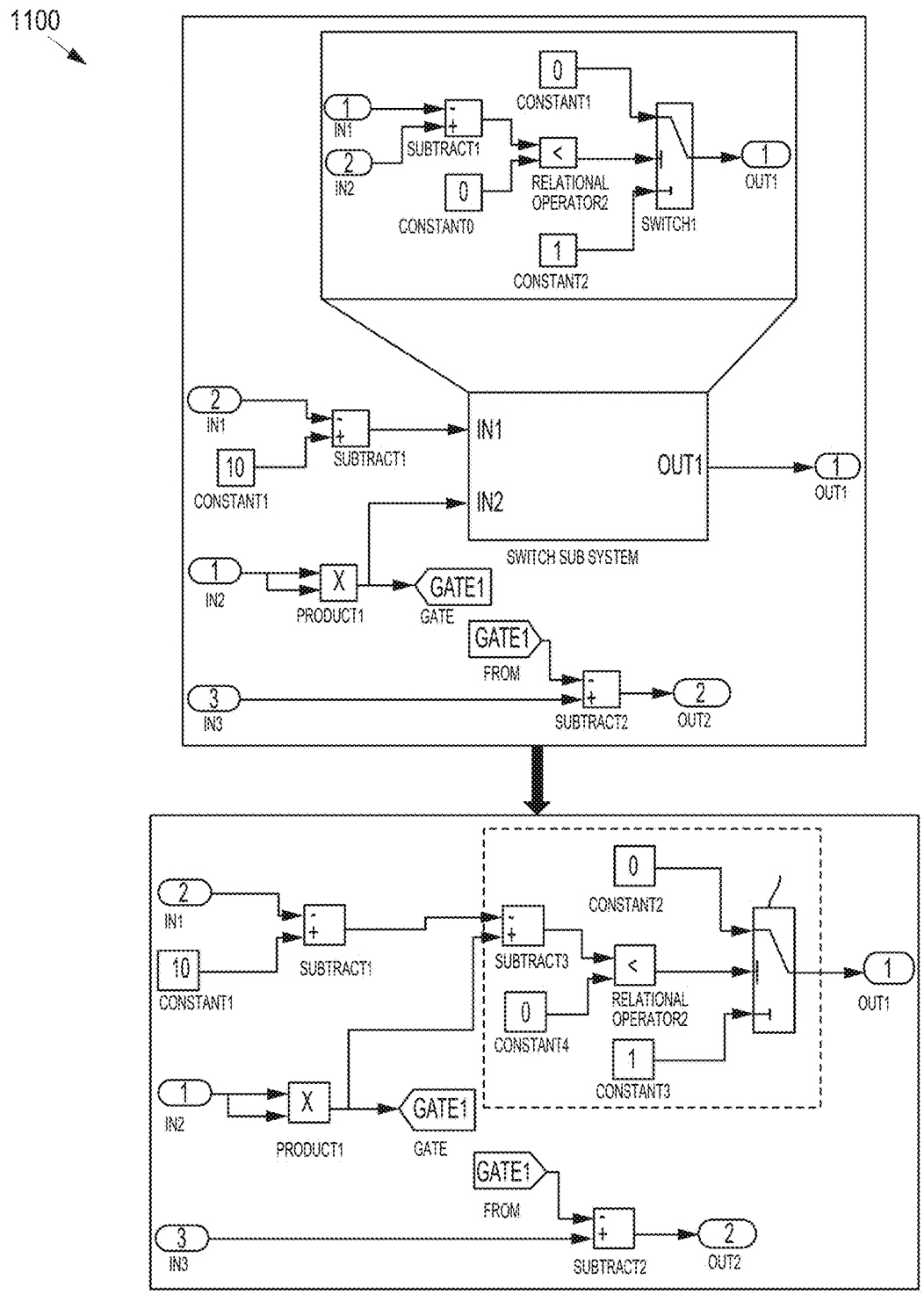
FIG. 11 is a schematic block diagram illustrating an exemplary model flattening of an exemplary MBD model according to an embodiment of the disclosure.

To identify at least one block within a model that has a branching structure, such as at block 1004 of FIG. 10, the obtained model may be flattened and analyzed. For example, regarding model flattening, a model 1100 to be instrumented may be provided as an input to a processor and a new list including only main blocks may be generated as shown in FIG. 11. During model flattening, all the block specific information about a model, including block type, parents, and connectivity may be read. "Goto" and "From" tags and redundant input and output ports of subsystems of the model may be discarded from the list of blocks. The flattened version of the model, i.e., the new list, may be captured in the form of a directed graph where a directed edge represents a connection from a source block to destination block. The implementation may be adopted with minor changes and integrated in the model instrumentation architecture.

Figure 12:
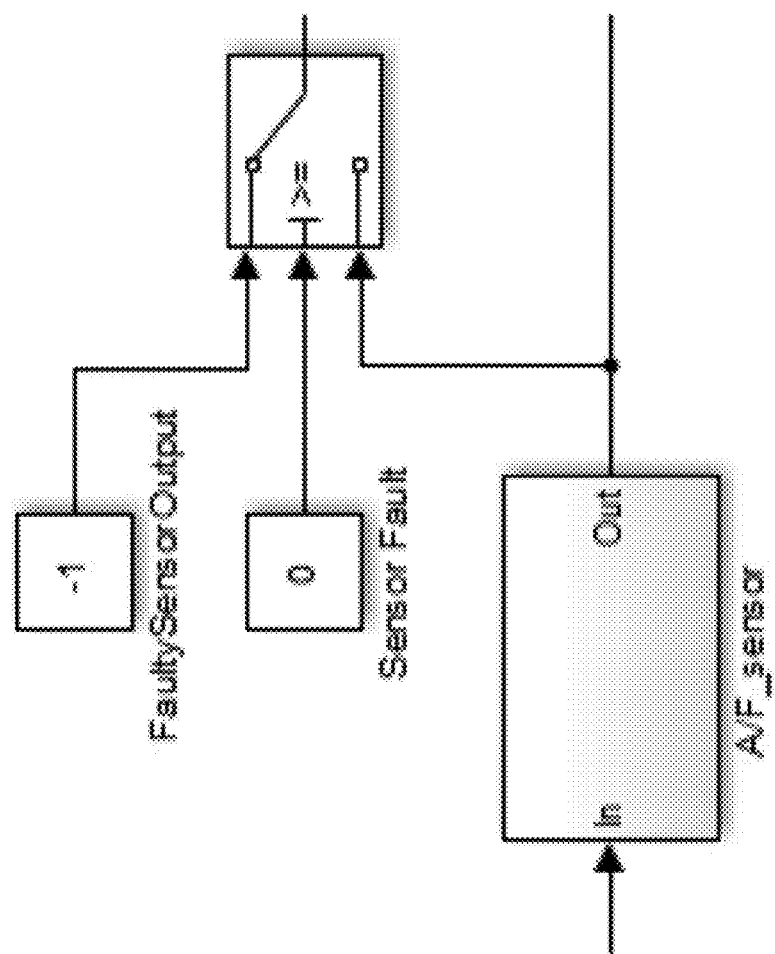
FIG. 12 is a schematic block diagram illustrating a switch block of an exemplary MBD model triggered by a constant value according to an embodiment of the disclosure.

Regarding model analysis, model analysis annotates the model for switch and saturation blocks. Because there can be a large number of switch and saturation blocks and all of them might not be significant for coverage analysis, some of them may need to be excluded. The module may be designed to accept a list of blocks that are to be excluded from the instrumentation and coverage analysis. Additionally, model analysis may automatically exclude switch blocks that are not good candidates for the coverage problem. For example, one such scenario 1200 is illustrated in FIG. 12. In FIG. 12, the switch block is triggered by a constant value. This implies that at all times only one of the possible modes is enabled. This type of hard coded values are often used by designers to manually activate only certain behaviors and such blocks add no value to the coverage problem. Hence, such blocks may be excluded from being further considered for instrumentation.

Figure 13:
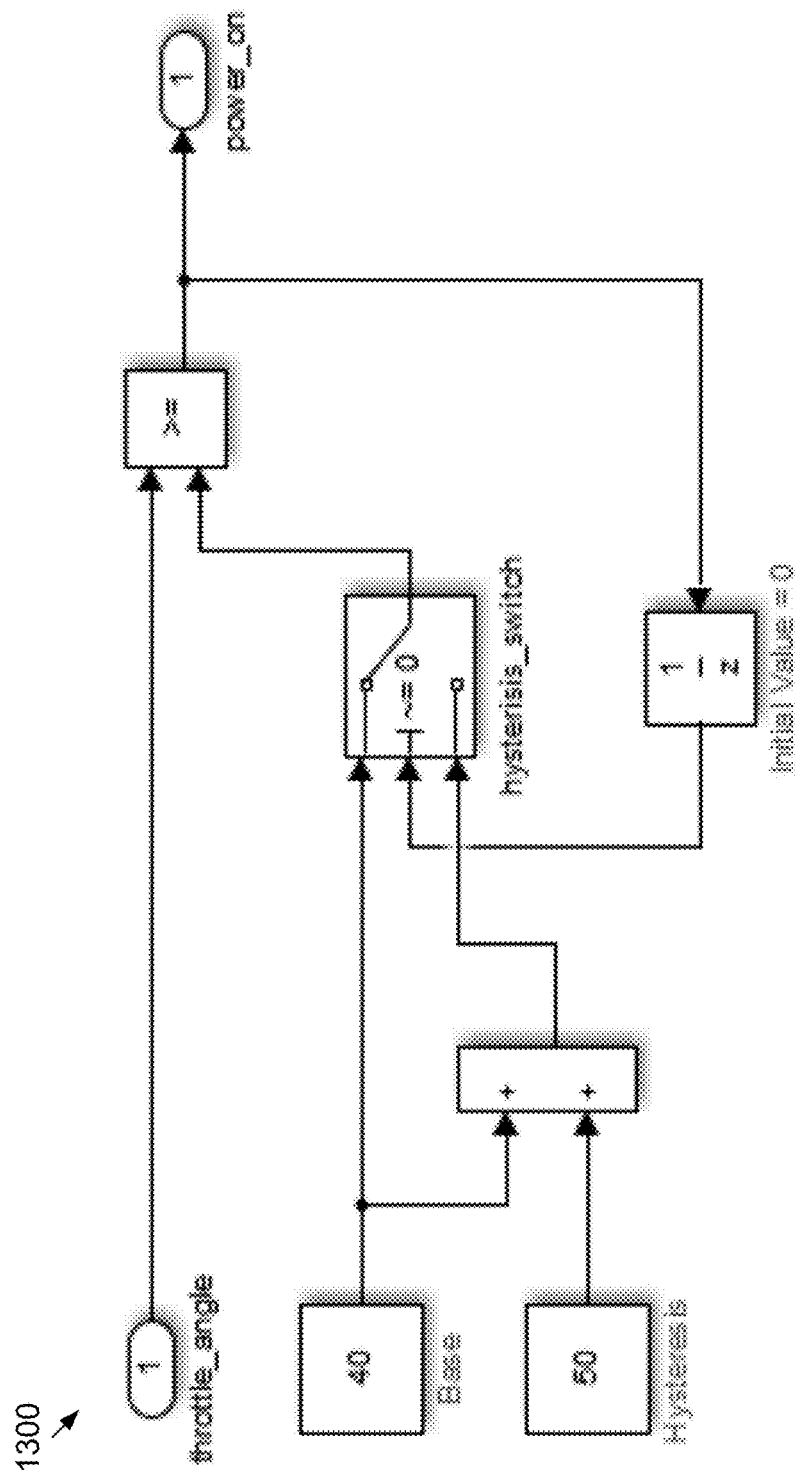
FIG. 13 is a schematic block diagram illustrating a switch and delay block of an exemplary MBD model according to an embodiment of the disclosure.
Figure 14:
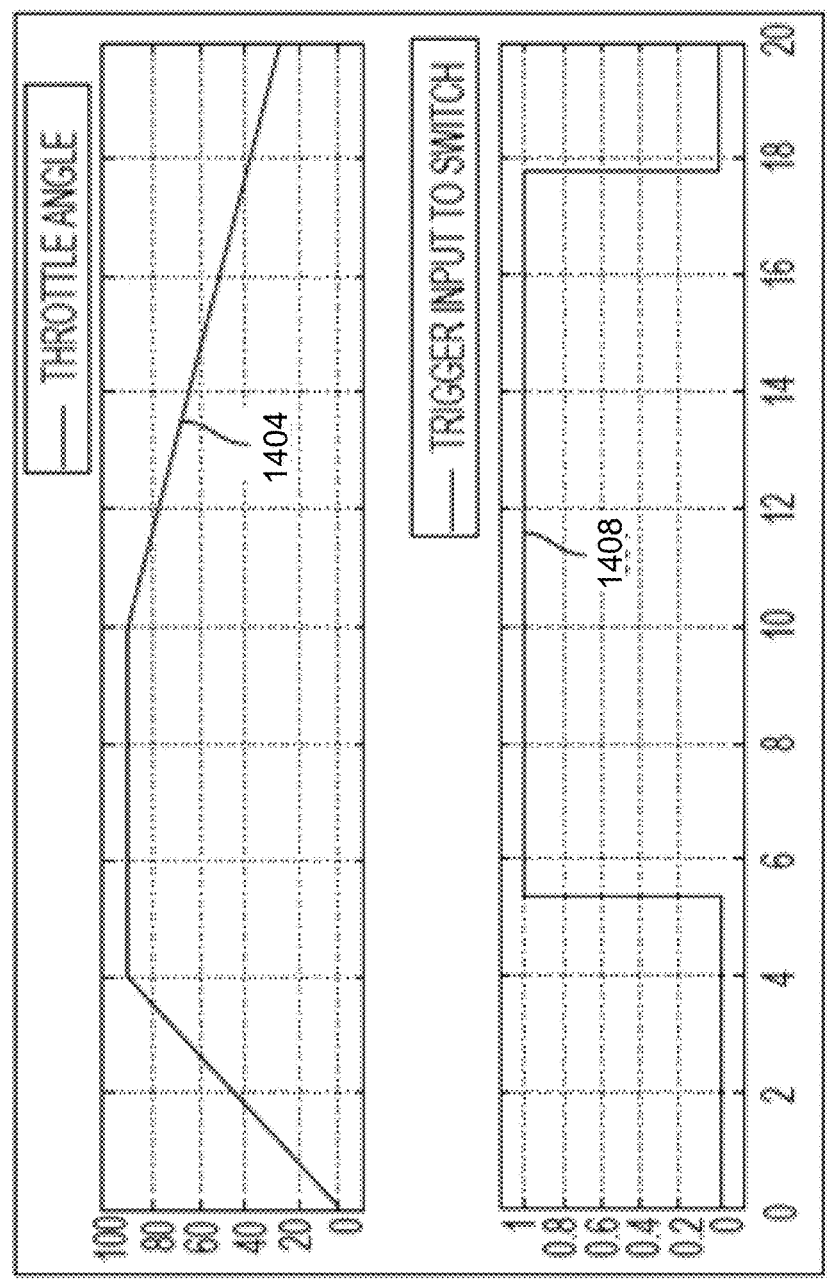
FIG. 14 is a simulation trace of a hysteresis subsystem of an exemplary MBD model according to an embodiment of the disclosure.

There can be other scenarios 1300 for block exclusion as for example in FIG. 13. The subsystem models a hysteresis loop for the throttle angle. A simulation trace 1400 of the subsystem is shown in FIG. 14. The hysteresis range is determined by the sum of the base constant value (40) and the hysteresis constant value (90). Initially the delay value is zero and the third input of the switch block, i.e., the value 90 is passed to the comparator block. When the throttle angle 1404 is greater than equal or equal to 90, the 'power_on' signal evaluates to one. Consequently, after the time delay specified by the delay block, the first input 1408 of the switch is passed to the comparator block. During this delay time, any change in the throttle angle input will not change the mode of the switch. After the delay time, the first input of the switch, i.e., the value 40 is passed to the comparator block. Now, when the throttle angle goes below 40, the new hysteresis constant of 90 is passed to the comparator after the delay time and the cycle continues.

Figure 15:
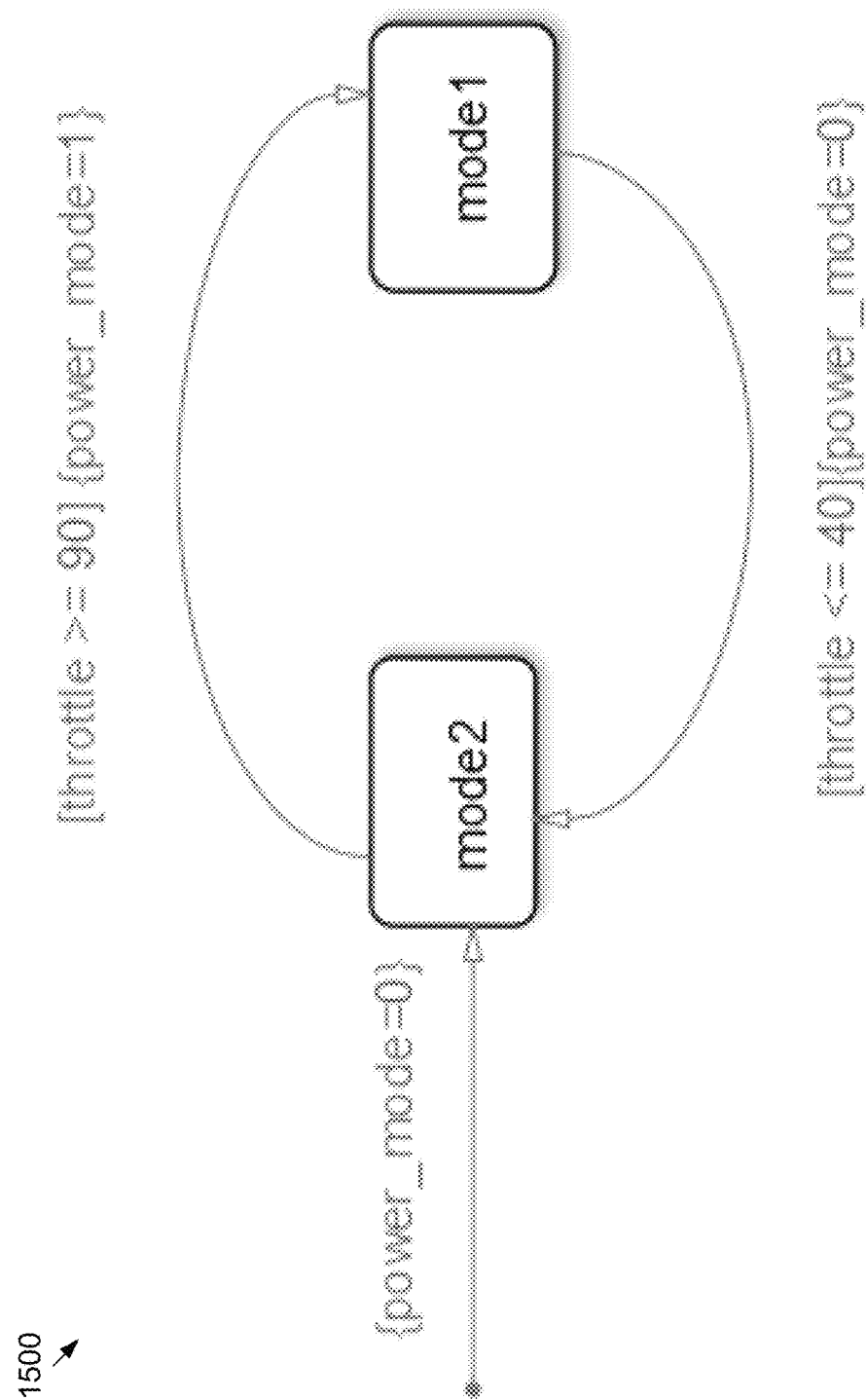
FIG. 15 is a state diagram corresponding to the switch shown in FIG. 13 according to an embodiment of the disclosure.

The Extended State Machine (ESM) 1500 that corresponds to 'hysterisis_switch' is shown in FIG. 15. The State mode1 corresponds to the input value of 40 and the State mode2 corresponds to the input value of 90.

As such, it may not be meaningful in some situations to instrument the switch block for coverage guidance. However, note that the comparator block in FIG. 13 may be instrumented if it is controlling another switch block downstream. The subsystem can be supported if the EFSM corresponding to the hysteresis loop is provided. The key to analyzing such components is that either they need to be modeled as Stateflow charts or model analysis tools need to be able to extract such information.

The model analysis component may be designed with the user interface in mind. It can be called independently out of the model instrumentation framework to obtain useful information about the model before running a full blown coverage analysis on the model. Potential extensions for model analysis may enable the user to have vital block information in the model.

After model flattening and model analysis, a first output port based on a state transition graph extracted for the identified block may be generated, such as at block 1006 of FIG. 10. Such a process includes "block instrumentation." During block instrumentation, a block instrumentation module performs the instrumentation of the blocks with branching behavior identified by the model analysis section. As an example, instrumentation may be performed on switch or saturation blocks.

Figure 16:
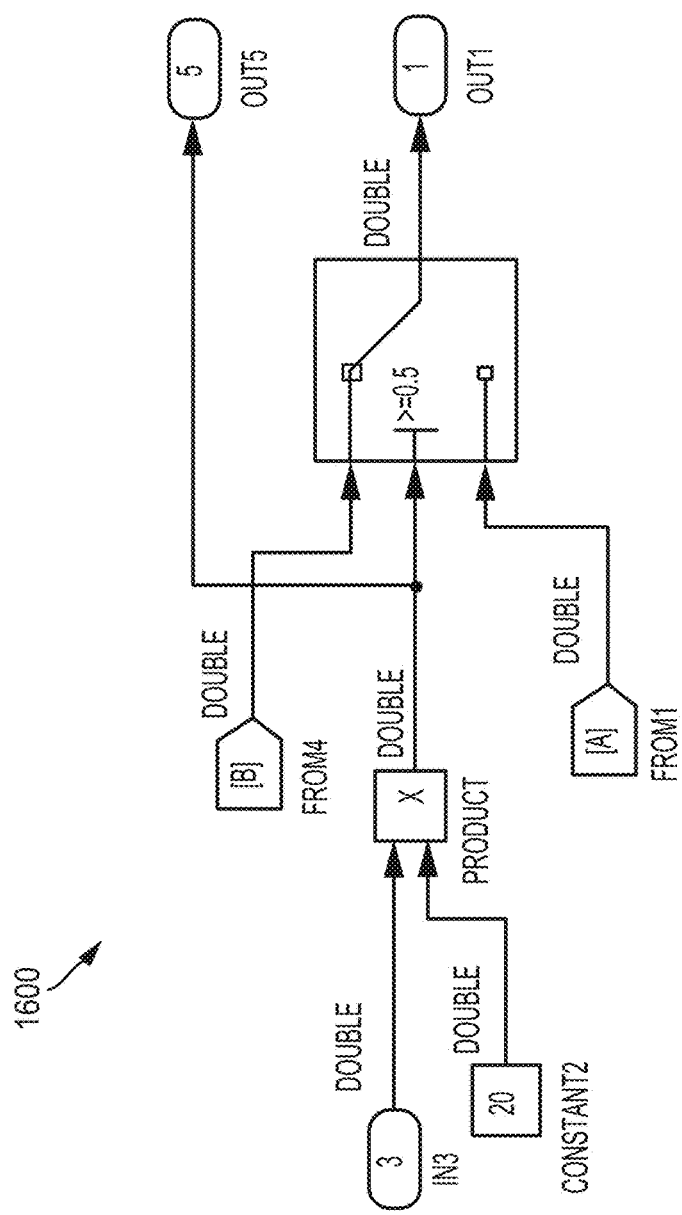
FIG. 16 is a schematic block diagram illustrating a switch block of an exemplary MBD model triggered by a double-precision input according to an embodiment of the disclosure.
Figure 17:
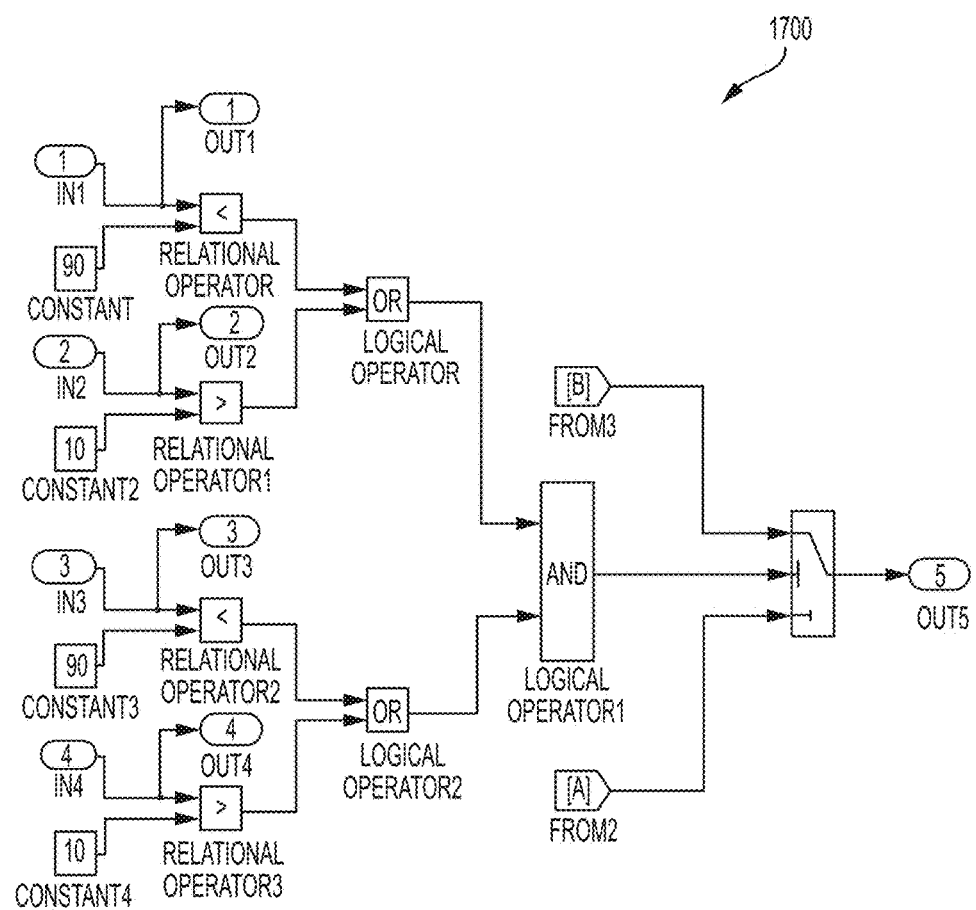
FIG. 17 is a schematic block diagram illustrating a switch block of an exemplary MBD model triggered by a Boolean function according to an embodiment of the disclosure.

As an example of switch instrumentation, the switch block 1600 in FIG. 16 is triggered by a real valued (double precision variable) input and the one in FIG. 17 is triggered by a Boolean value. These two cases are handled separately as the methodology of their analysis differs slightly.

Consider FIG. 16 which shows the switch block after instrumentation. The output port 'Out5' is automatically added by the instrumentation process. The output port 'Out5', which is part of the set $Y_A$, is utilized to compute the distance metric used in the optimization engine of S-TaLiRo. In this particular example, the value of 'Out5' can be compared with the threshold value of the switch, which in this case is 0.5. The difference between these two values provides a measure of distance to each of the states. This output port value forms the crux for obtaining the state transition graph of the above switch block. A more detailed explanation on the generation of state transition graph is provided later in this disclosure.

The switch blocks triggered by Boolean input values are analyzed more rigorously. The Boolean input to the middle port of the switch blocks maybe the output of a Boolean circuit. An example is illustrated in FIG. 17. In this case, the Boolean circuit 1700 consists of four compare blocks and three logical operators. The output of the comparison blocks are the result of the comparison made between the input block and the constant blocks present in the left end of FIG. 17. These outputs are evaluated by a Logical OR block and then by a Logical AND block to determine the trigger input to the switch block. When the output of the 'AND' block evaluates to 'TRUE', signal B (mode 2) is passed. Similarly, signal A (mode 1) is passed when the output is 'FALSE'.

It can be seen that mode coverage of the switch block can be obtained by the conditional coverage of the Boolean circuit. Hence, the auxiliary output ports are added at the relation operator blocks which can be used to compute the distance metric $d_h^{max}$. These outputs are termed as numerical output ports and are part of the set $Y_A$. These output ports will be used in formulating the guards for the state transition of the switch. Additionally, an output port is added at the trigger port of the switch to determine whether the switch is in state A or B. The latter output ports are termed "location output ports" and are part of the set $Y_F$.

Once the output ports have been added, the instrumentation process also automatically extracts the Boolean function that decides the state of the switch. The graph information obtained from the model flattening is used for this process. It is possible that the Boolean function may be implemented in a separate subsystem and failure to flatten the model may lead to improper instrumentation. From the main flattened graph, a small subset graph establishing the connectivity information of the switch block is obtained. A DFS search is performed on this graph to identify the relational blocks and Logical blocks and the Boolean function is extracted in the form of a string. For the above example, the instrumentation will produce a string as:

((O1<90)||(O2>10))&&((O3<90)||(O4>10))

Then, the string is processed to obtain a mapping of the predicates to Boolean literals. The predicates (O1<90), (O2>10), (O3<90) and (O4>10) are replaced by Boolean literals, say p1, p2, p3 and p4 respectively and the Boolean string '(p1||p2) && (p3||p4)' is used for further analysis. A predicate table is generated with the mapping information of the predicates and the corresponding Boolean literals. However, note that the Boolean function may not be in a Disjunctive Normal Form (DNF). The DNF representation is convenient for obtaining the state machine representation of the switch and, consequently, it is easier to perform distance computation under the metric $d_h^{max}$. Hence, the Boolean formula is converted to its equivalent DNF representation.

Figure 21:
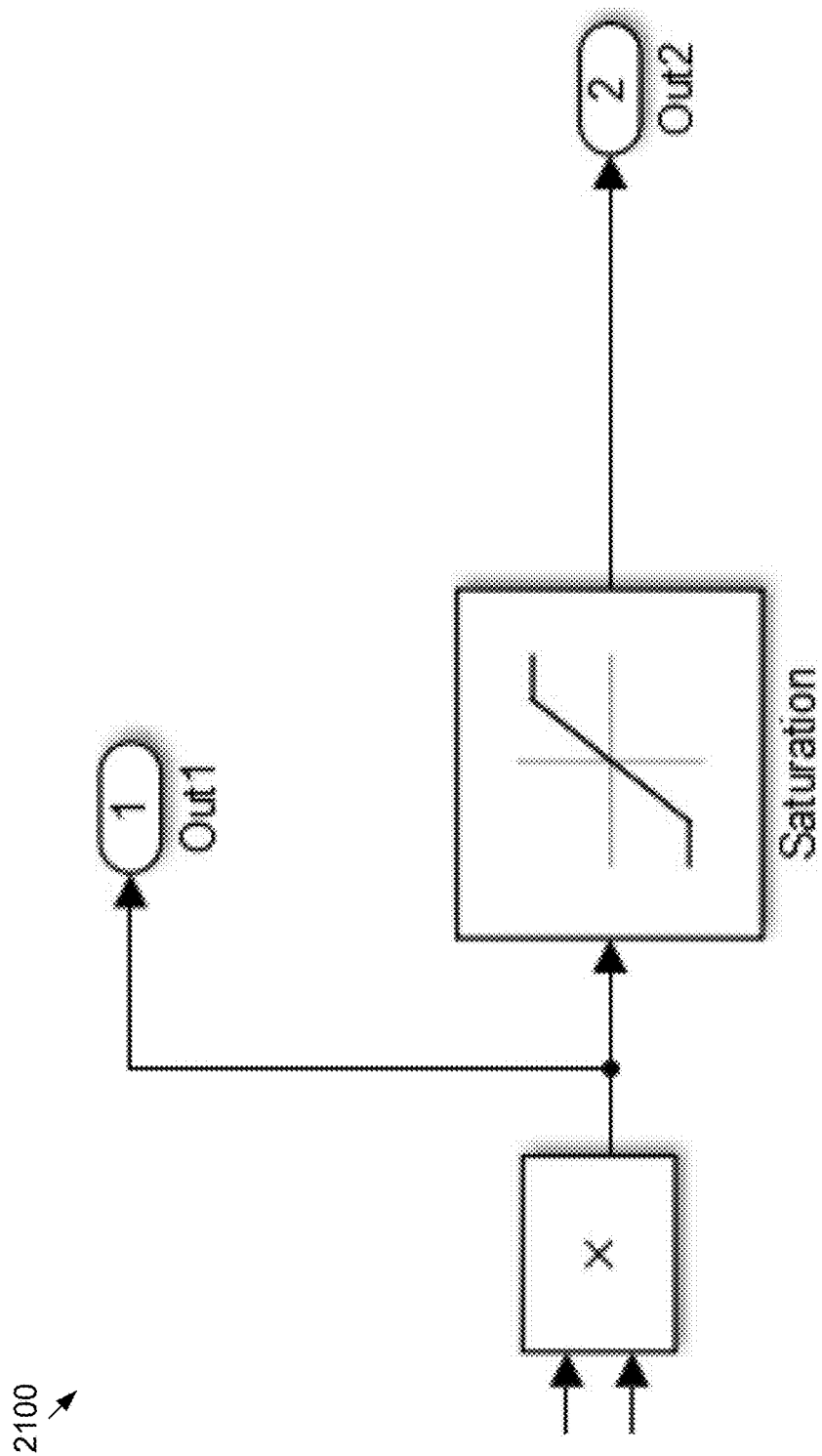
FIG. 21 is a schematic block diagram illustrating a saturation block instrumentation of an exemplary MBD model according to an embodiment of the disclosure.

For a DNF Conversion Methodology, a Boolean formula is in Disjunctive Normal Form (DNF) if it is a disjunction of conjunctive clauses or, in other words, if it is in Sum of Products (SOP) form. When any one of the conjunctive clauses is evaluated to true, the whole Boolean formula evaluates to true value. Now each of the conjunctive clauses provides a sense of distance from the transition state A to state B of the switch (FIG. 21). Hence the conditional coverage on the conjunctive clauses will result in mode coverage of the switch.

Figure 18:
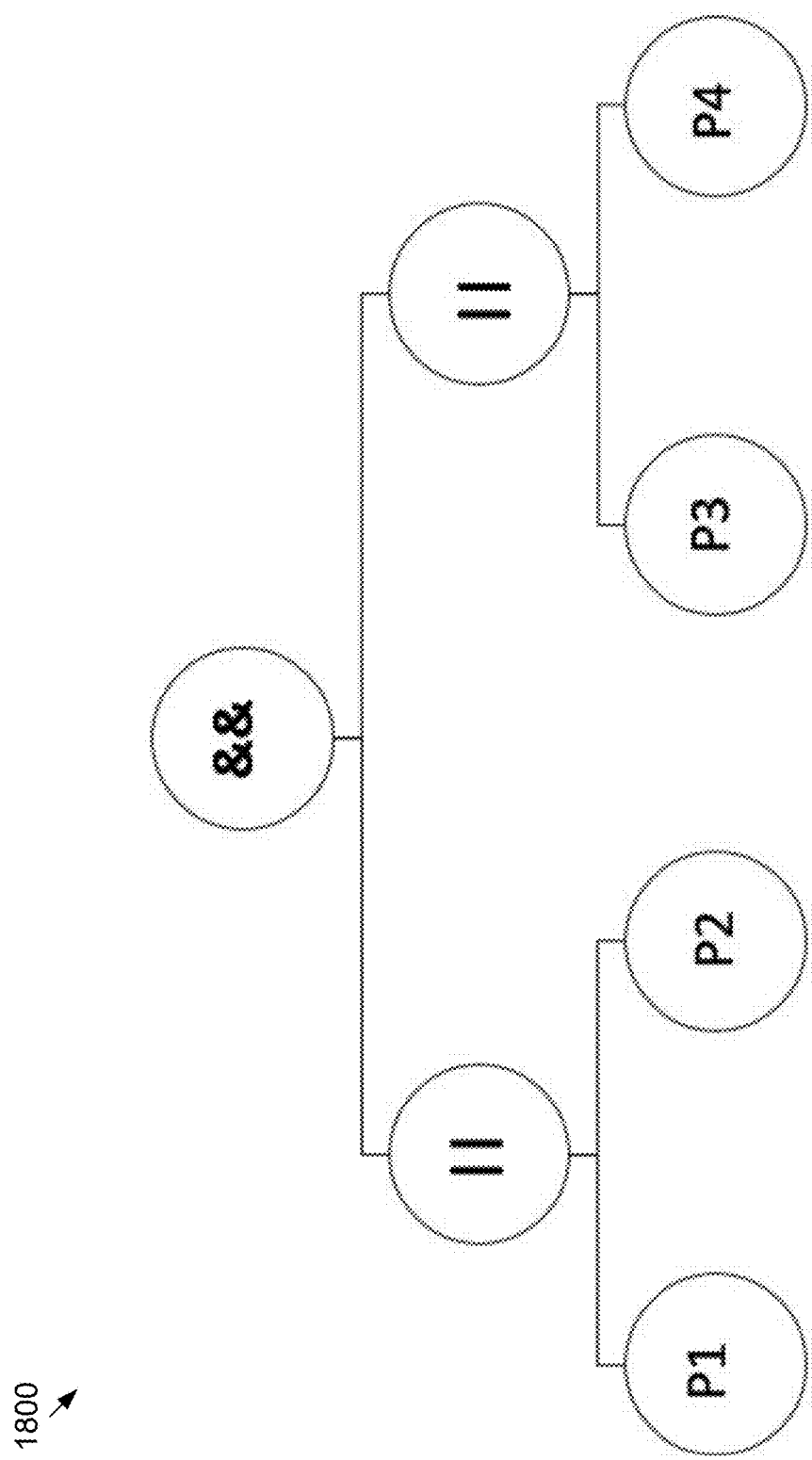
FIGS. 18-20 are expression tree diagrams illustrating an exemplary Disjunctive Normal Form (DNF) conversion according to an embodiment of the disclosure.

The main steps involved in the DNF conversion are illustrated through an example for the switch block shown FIG. 17. First, an expression tree is built for the formula '(p1||p2) && (p3||p4)' using a stack based approach as shown in FIG. 18. The Boolean literals form the leaves of the tree data structure and the Boolean operators '||' and '&&' constitute the parent nodes. The formula is converted to DNF by iteratively applying logical equivalences, such as double negation elimination, De Morgan's law and the distributive law throughout the tree. The steps involved in the conversion can be summarized as:

The negation is moved inwards recursively. In the process, De Morgan's law and double negation are applied The AND operator is distributed over the OR operator recursively in the tree.

The clauses that always evaluate to false, if any are removed.

Figure 19:
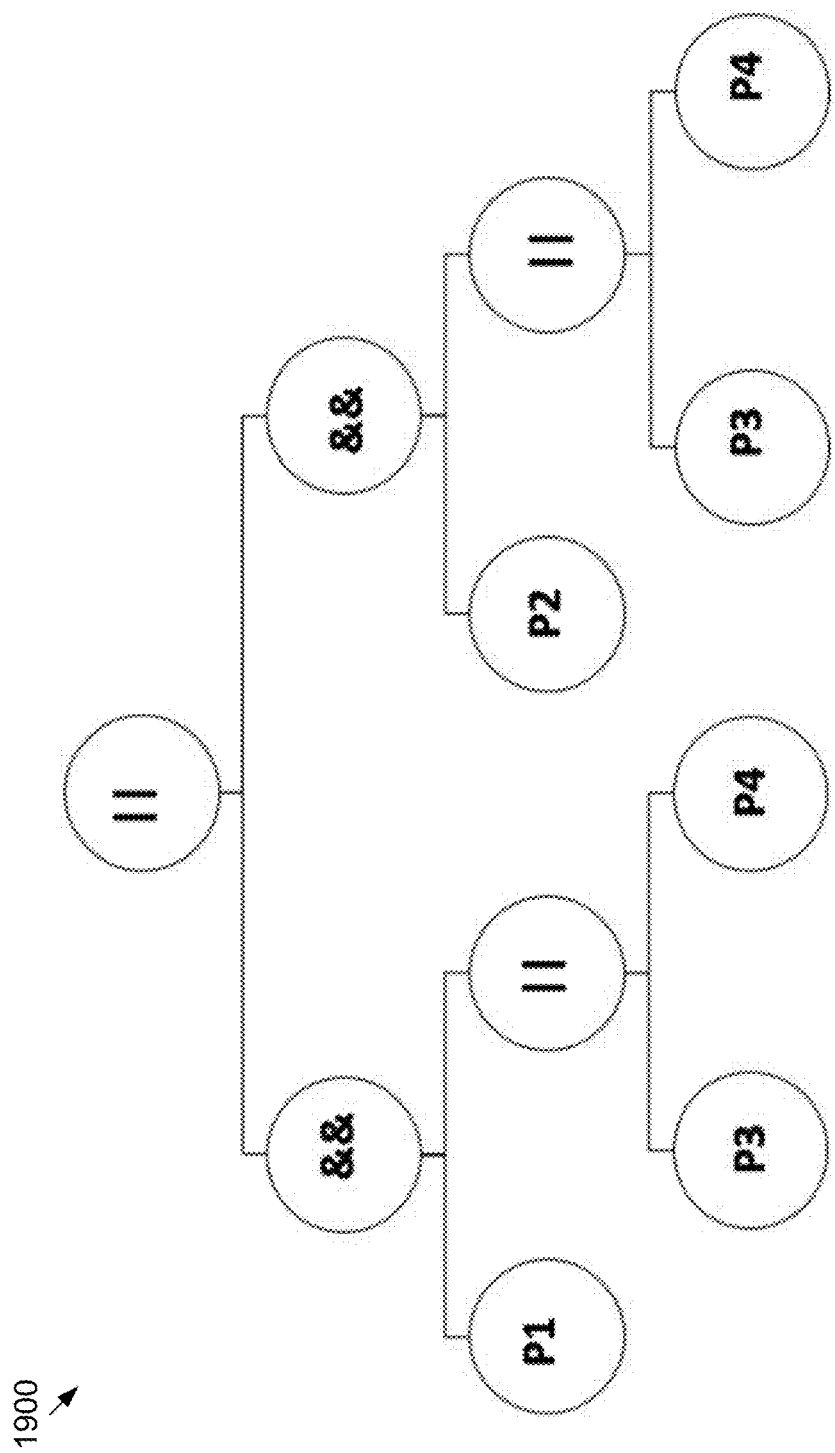
Figure 20:
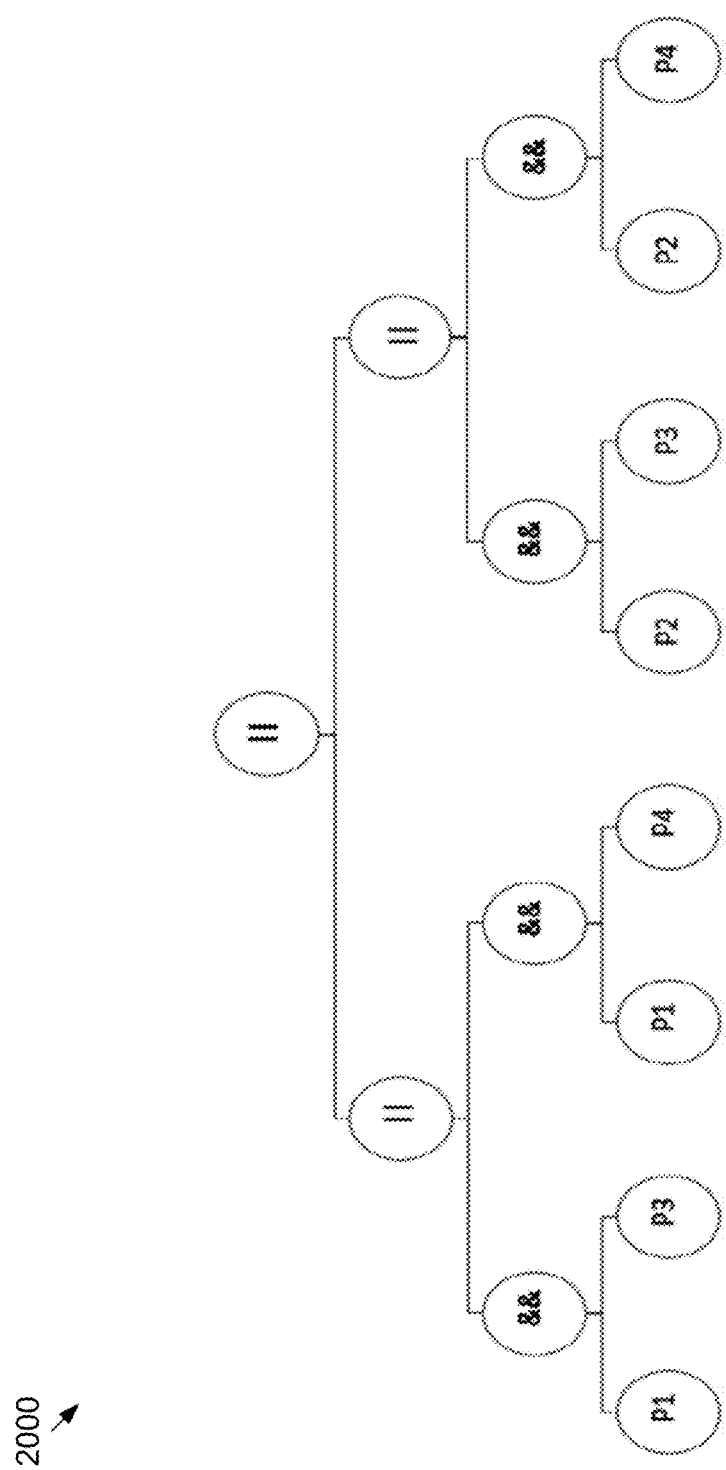

The above steps are applied to the tree 1800 shown in FIG. 18. The result of the algorithm is shown in tree 1900 of FIG. 19 and tree 2000 of FIG. 20. FIG. 19 illustrates the intermediate step where the '&&' (AND) operator is distributed over the '||' (OR) operator. Finally, FIG. 20 illustrates the tree in DNF after recursively applying the algorithm.

The tree in DNF representation is read in infix order to obtain the Boolean formula in its equivalent DNF. Hence, the conversion of the formula '(p1||p2) && (p3||p4)' results in '(p1&& p3)||(p1&& p4)||(p2&& p3)||(p2&& p4)'. Similarly, the negation of the formula after conversion results in '(!p1&& !p2)||(!p3&& !p4)'. The Boolean formula in DNF along with the predicate mapping are used to develop the state transition graph for the switch. The details are discussed in the discussion below regarding state transition graph generation. The complete implementation may be done in C language and interfaced with MATLAB using the MEX compiler.

As an example of saturation block instrumentation 2100, consider FIG. 21. A saturation block imposes upper and lower limits on the input signal. The input signal is passed to the output of the block when it falls between the lower and upper limits. In this case, there are three possible modes that the block may operate at any given point in time: lower saturation, upper saturation or no saturation. The instrumentation of the saturation blocks is similar to the switch blocks triggered by double precision valued input signals. FIG. 21 shows the instrumentation of a saturation block. The output port 'Out1' is added at the input port of the block. The value of the output port 'Out1' can be used to compute the distance from the different operating modes of the saturation block and it is part of the set $Y_A$. Additionally, in an outer harness the value of 'Out1' can be used to determine the mode of the saturation block which is added to set $Y_F$. These blocks with branching structure may be present inside subsystems of the model. The instrumentation is performed recursively and the output ports are brought to the upper most layer of the model.

In some embodiments, redundancy during instrumentation may be avoided. In particular, during the instrumentation of a block, it is possible that the output port already exists and the addition of a new output port can result in redundancy. The block instrumentation takes into account this possibility by checking for the existence of the output port. In case the output port already exists, it simply returns the ID of the existing output port which can be used when generating the corresponding EFSM. In essence, there is no duplication in the output sets of the system model, $Y_\Sigma$, $Y_A$, and $Y_F$. The instrumentation may fail to avoid redundancy when the existing output port in a subsystem is brought out to the upper most layer of the model with a different name. In this case, the instrumentation issues a warning and adds a redundant output port in either of the set $Y_A$ or $Y_F$. In any case, redundancy does not affect the correctness of the framework.

Different approaches may be taken to select blocks for instrumentation. In some embodiments, all the supported blocks with branching behavior may be instrumented. Inputs from users may be used to exclude some blocks from the instrumentation process. In addition, some redundant blocks may be identified automatically and excluded from the instrumentation. In other embodiments, certain heuristics may be developed to disregard blocks that need not be considered for instrumentation.

State Transition Graph Generation, i.e., the automatic extraction of the EFSM for the blocks, is an important aspect of the automation process. Prior to implementation of this framework, the user had to manually go through the model to identify the branching blocks and analyze them to obtain their EFSM. This entire process can now be done at the click of a button.

In some embodiments, a module obtains the state transition graph for the instrumented switch and saturation blocks. In particular, a switch block can be modeled as an EFSM with two states s1 and s2 and a transition guard $G(s1, s2) \subseteq R^n = Y$, where Y is the output space of the system $\Sigma$. A transition from s1 to s2 is enabled if and only if $y(t) \in G(s1, s2)$. In S-TaLiRo, a data structure called "Guard" is used to capture the EFSM representation. The Guard which captures the transition relation G, captures the inequality form $Ay \leq b$ where y is vector of the output space of $\Sigma$ of size $\#(Y_\Sigma) + \#(Y_A)$ where $\#(Y)$ indicates the dimensionality of the space Y and A is a matrix of size $m \times (\#(Y_\Sigma) + \#(Y_A))$ where m is the number of constraints that define the polyhedron G(s1,s2). In addition to the Guard structure, an adjacency graph structure 'CLG' (Control Location Graph) is used to represent the possible transitions from a given state to another.

The details of obtaining the 'Guard' and 'CLG' structure are illustrated here. First, a simple example of a double precision input triggered switch block is presented. Then, a slightly complex example of a Boolean value triggered switch block will be discussed.

Figure 22A:
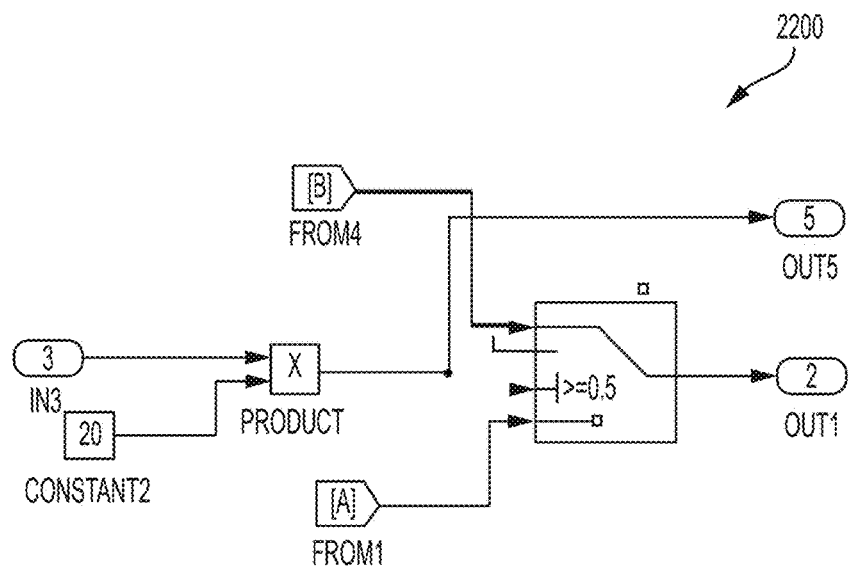
FIGS. 22A-B are an exemplary code block and corresponding state diagram, respectively, of an exemplary double precision input value triggered switch block according to an embodiment of the disclosure.
Figure 22B:
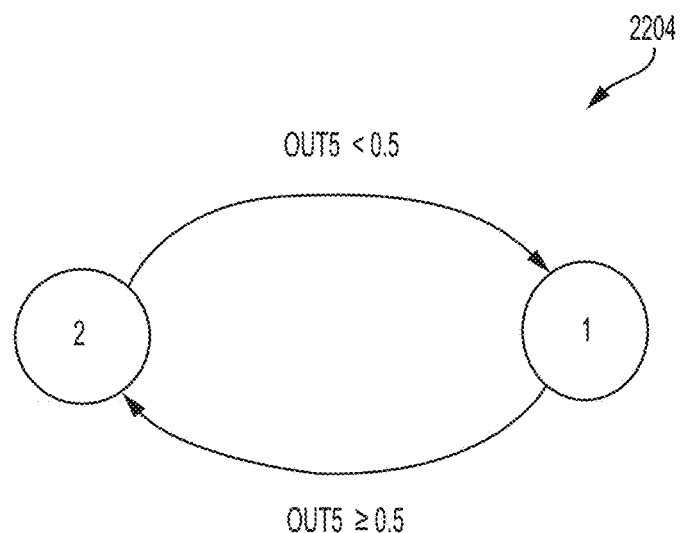

For convenience, a switch block 2200 and its EFSM representation 2204 is shown in FIGS. 22A-B, respectively. The EFSM is depicted with state numbers one and two. State 1 corresponds to operating mode one of the switch block where signal A is passed to the output. State 2 corresponds to the mode two of the switch block where signal B is passed. It can be seen that the guard relation for the transition from State 1 to 2 is captured by the equation 'Out5≥0.5'. The 'Guard' structure employed in S-TaLiRo uses the matrices 'A' and 'b' to capture the transition relation. For this example the 'Guard' may be formulated as:

Guard (1,2). $A$=[0 0 0 0 −1 0 . . . 0] Guard (1,2).
$b$=−0.5 where A is row vector of size $\#(Y_\Sigma) + \#(Y_A)$, i.e., the original output ports plus the auxiliary output ports added by instrumentation.

The matrix A has a value −1 in the fifth position and the value of b is −0.5 which represents the guard relation in the form '−Out5≤−0.5' which is equivalent to the equation 'Out5≥0.5' since it is the convention to represent the guards in A y≤b form.

Similarly the guard relation for the transition from state 2 to 1 based on the equation 'Out5<0.5' is obtained as:

Guard (2,1). $A$=[0 0 0 0 1 0 . . . 0] Guard (1,2).
$b$=0.5

The data structure "Guard" actually captures the inequality "Out5≤0.5" and not "Out5<0.5". However, this is not an issue since the guard is used to compute the robustness value and not whether the guard is activated. For example, when Out5=0, the robustness of both "Out5≤0.5" and "Out5<0.5" is the same, i.e., 0.5.

The adjacency graph 'CLG' for the switch contains the possible transitions from State 1 and the possible transitions from State 2. In case of a switch block, there is only one possible transition that can be taken from a given state and the 'CLG' can be simply expressed as:

$CLG\{1\}=[2]$;

$CLG\{2\}=[1]$;

In general, 'CLG' is a cell array whose length is equal to the number of states of the automaton. The contents of each cell is a vector containing the possible transition from that state. For a switch block, the only possible transition from state 1 is to state 2. Hence, CLG{1} is single vector with value 2.

Figure 23:
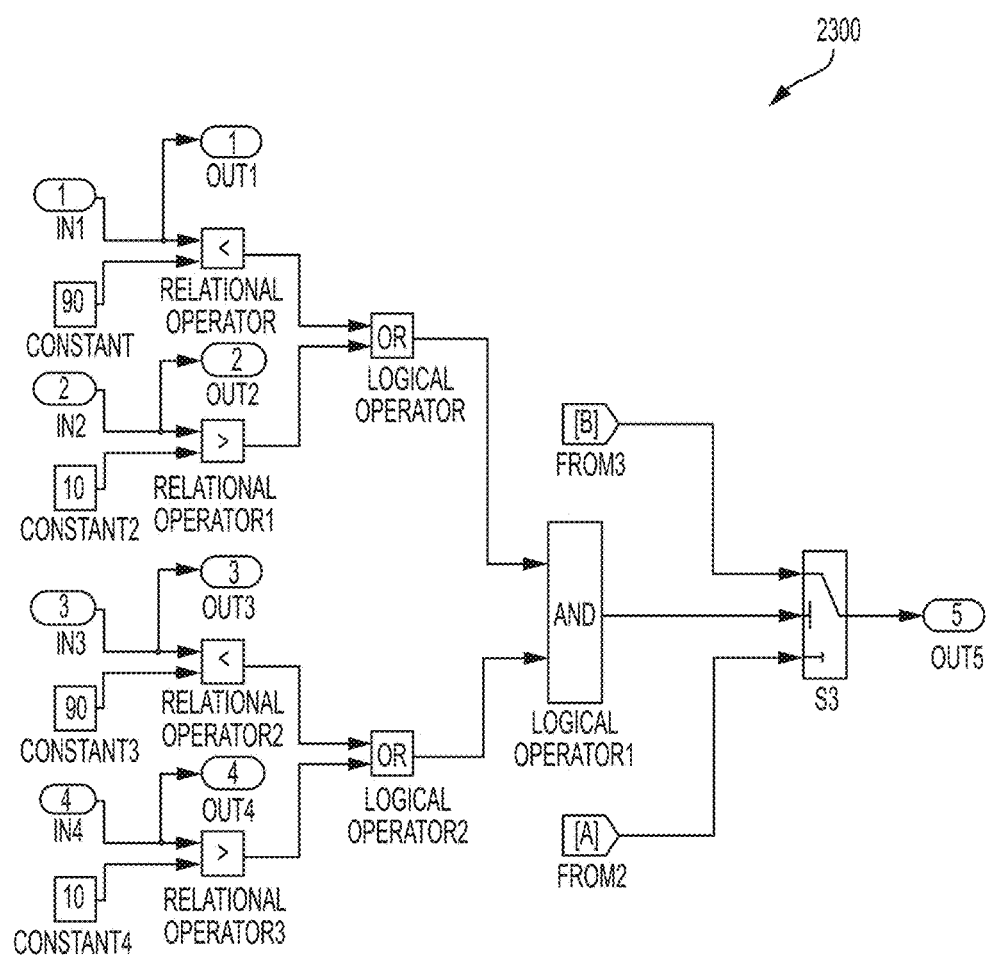
FIG. 23 is a schematic block diagram illustrating a switch block of an exemplary MBD model triggered by a Boolean value output according to an embodiment of the disclosure.

Now, a more complex switch block triggered by a Boolean value input is considered for illustrating the process of obtaining the EFSM. The switch block 2300 is provided here for convenience in FIG. 23. The previous instrumentation module obtains the Boolean formula in DNF that triggers the switch. For this example, the Boolean formula in DNF for the 'TRUE' condition (Signal A) is obtained as '(p1 && p3)||(p1&&p4)||(p2&&p3)||(p2&&p4)' and the formula in DNF for the 'FALSE' condition (Signal B) is '(!p1 && !p2)||(!p3&&!p4)'. The Boolean literals, i.e., p1, p2, p3 and p4 are mapped to the predicates of each compare block. For example, p1 corresponds to the predicate 'Out1<90'. TABLE 1 below shows the mapping of predicates to the corresponding Boolean literals.

TABLE 1

Mapping of Predicates to the Corresponding Boolean Literal

| Predicate in the model | Boolean literal |
| --- | --- |
| Out1 < 90 | p1 |
| Out2 > 10 | p2 |
| Out3 < 90 | p3 |
| Out4 > 10 | p4 |

Figure 24:
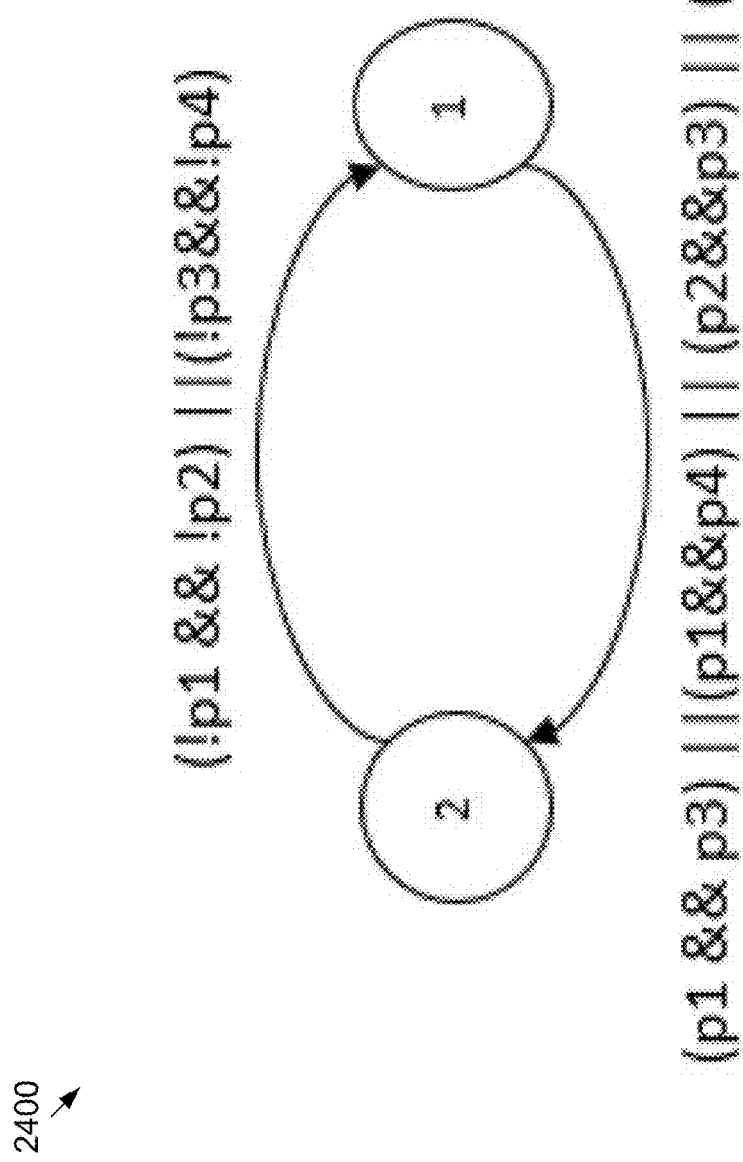
FIG. 24 is a state diagram corresponding to the switch block of FIG. 23 according to an embodiment of the disclosure.

The EFSM 2400 for the switch block S3 is depicted in FIG. 24. The convention for the state is the same as the one introduced previously. The State 1 and 2 in the EFSM correspond to the signal A and signal B being passed to the output. The guard that corresponds to the transition from mode one to two is given by the DNF formula when it evaluates to 'TRUE'. Hence the formula '(p1 && p3)||(p1&&p4)||(p2&&p3)||(p2&&p4)' represents the guard for the transition from mode one to two. Similarly, the guard for transition from mode two to one corresponds to the expression '(!p1 && !p2)||(!p3&&!p4)'.

The 'Guard' structure captures the transition relation corresponding to each of the conjunctive clauses in the DNF expression. Consider the guard representation for the transition from mode one to two and the corresponding first conjunction expression '(p1 && p3)'. The structure is obtained as:

$$\text{Guard}(1, 2) \cdot A\{1\} = \begin{bmatrix} 1 & 0 & 0 & 0 & 0 & \ldots & 0 \\ 0 & 0 & 1 & 0 & \ldots & 0 \end{bmatrix} \text{Guard}(1, 2) \cdot b\{1\} = \begin{bmatrix} 90 \\ 90 \end{bmatrix}$$

Now the field 'A' is a cell vector with each cell corresponding to a disjunctive clause in the expression (in this example there are 4 clauses). The first element in the cell A, i.e., A{1} and in the cell b, i.e., b{1} capture the predicate 'Out1<90' (mapped as p1). The second element captures the expression 'Out3<90'. In essence, the Guard shown above captures the information that the transition from mode one to two is enabled when 'Out1<90' and 'Out3<90' simultaneously. In a similar way, the Guard data corresponding to the other conjunctive clauses are obtained.

Along the same lines, the Guard for the transition from mode two to mode one can be derived easily. In this case, the expression '(!p1 && !p2)||(!p3&&!p4)' is utilized to obtain the Guard. The size of the cell 'A' and 'b' will be two corresponding to the two conjunctive clauses (!p1 && !p2) and (!p3&&!p4).

Each of the guards that correspond to an individual conjunctive clause in the DNF formula represent a different set. The disjunction of the linear inequalities is used to set up a convex optimization problem by the optimization engine of S-TaLiRo.

The same approach is employed for saturation blocks to obtain the equivalent EFSM. In this case there are three states s1, s2 and s3. The states s1 and s3 correspond to the lower and upper threshold value of the saturation block. The Guard structure obtains the transition relation between each of these states in the same manner as illustrated for the switch blocks.

Figure 25:
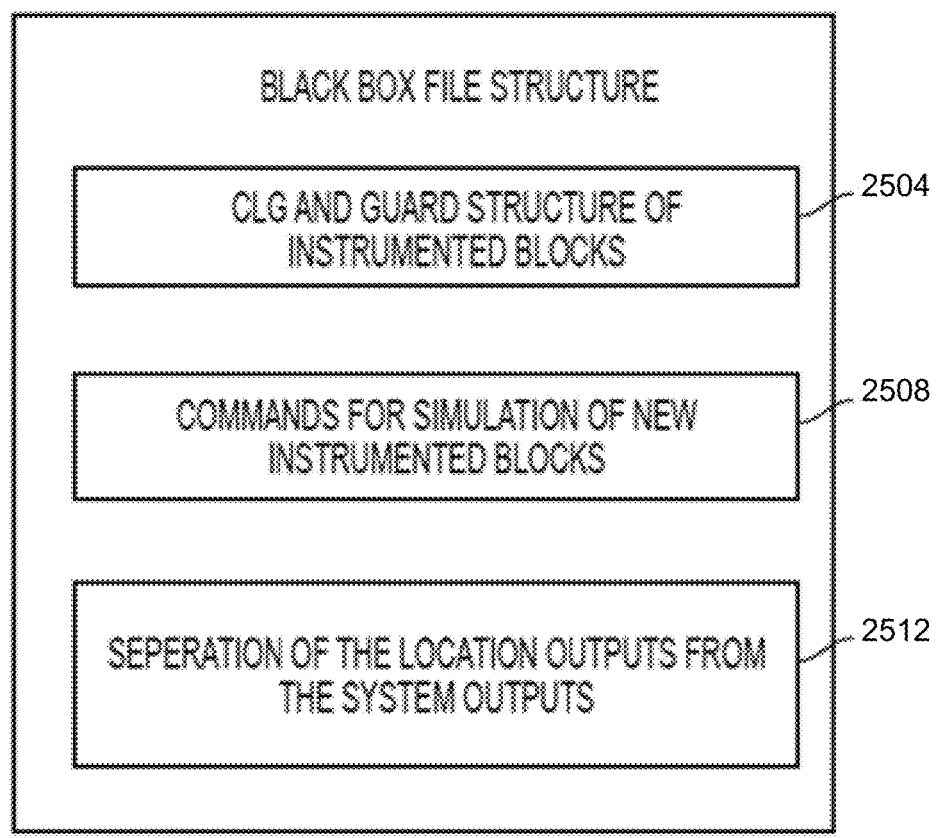
FIG. 25 is a schematic block diagram illustrating an exemplary black box file structure according to an embodiment of the disclosure.

In some embodiments, the first output port generated based on the extracted state transition graph may be combined with at least a second output of the system included in the model, such as at block 1008 of FIG. 10. This may include creating a black box file interface 2500 for the model as shown in FIG. 25. The creation of the black box file is a component of the model instrumentation process. The black box file forms an interface to a test engine, such as the S-TaLiRo test engine. It may be an executable MATLAB function file (m-function). The CLG and Guard structures corresponding to the instrumented blocks obtained from the State Transition Generation module are written in the first section 2504 of the file. However, the CLG and Guard structures can also be initialized in advance rather than when the black box file is executed.

In the second section 2508 of the file, the commands corresponding to the simulation of the new instrumented Simulink model are written. The system can be simulated using the MATLAB 'sim' function for Simulink models. When this file is executed, the new instrumented model is simulated and the output trajectory of the system is obtained, i.e., system output trajectories and auxiliary outputs introduced by the instrumentation process. In particular, this output trajectory will now also contain the information related to the modes of the switch and saturation blocks ($Y_F$) due to the output ports added during the instrumentation process.

In the third section 2512 of the black box file, the output ports corresponding to the locations are separated from the output ports used for the computation of the distance metric ($d_h^{max}$). The values of the location output ports are used to determine the modes of the block.

Let 'sim_model' is the model to be instrumented. Then, a black box m-file with the name 'BlackBox_sim_model' may be created with the following input-output interface:

[T, XT, YT, LT, CLG, Grd] = BlackBox_sim_model (simT, TU, U)
Inputs:
simT - simulation time for the model
TU - the discrete time steps in the simulation same 'simT'
U - The control input to the system Outputs:
T - Time vector returned from the MATLAB sim command
XT - The state returned from the MATLAB sim command
CLG - Control Location Graph possible state transition for each instrumented block
Grd - Guard structure of each instrumented block
LT - Location value of each instrumented block
YT - Output space after the location output ports are separated from the system output space.

Hence, after the execution of the black box file in S-TaLiRo, the following three pieces of information are obtained: (1) the state transition graph and the guard relations for the blocks with branching structure in the model; (2) the mode (location) information of the blocks with branching structure, $Y_F$; and (3) the auxiliary output space of the system $Y_A$ which is used to compute the distance metric $d_h^{max}$.

After the output ports generated from the model instrumentation process are combined with other outputs of the model, model verification of the model that utilizes the first and second output ports may be performed, such as at block 1010 of FIG. 10.

In some embodiments, this disclosure may represent a framework for robustness guided model checking of Stochastic Cyber-Physical Systems. The framework may utilize the theory of robustness of metric temporal logic specifications to convert the verification problem into an optimization problem of expected system robustness, and the optimization problem may be solved by utilizing Monte Carlo methods that provide finite time guarantees. The framework may also implement the model instrumentation schemes disclosed herein to improve the model verification scheme. The framework may also be configured to perform coverage analysis and coverage guided falsification.

If implemented in firmware and/or software, the functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present invention, disclosure, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

The claims are not intended to include, and should not be interpreted to include, means-plus- or step-plus-function limitations, unless such a limitation is explicitly recited in a given claim using the phrase(s) "means for" or "step for," respectively.

What is claimed is:

1. A method for model verification, comprising:
   obtaining, by a processor, a model for a system;
   identifying, by the processor, at least one block within the model that has a branching structure;
   identifying, by the processor, at least one model variable affecting a switching condition of the identified at least one block;
   generating, by the processor, an extended finite state machine modeling a switching behavior of the identified at least one block by using the at least one model variable;
   combining, by the processor, at least one output variable of the extended finite state machine with at least one of a first output port and a second output port of the system included in the model; and
   performing, by the processor, model verification and coverage of the model that utilizes outputs from the first output port and the second output port to verify the model,
   wherein performing the model verification comprises performing coverage analysis by collecting coverage statistics for at least the first output port, and performing coverage guided falsification comprises:
     determining if a falsification process executed as part of the model verification process has terminated successfully or unsuccessfully; and
     modifying the model verification process to perform a coverage-guided falsification process in which preference is first given to combinations of modes of the model that were evaluated as part of the model verification process and had the lowest coverage statistics based on the collected coverage statistics, wherein performing a coverage-guided falsification process comprises minimizing a robustness of the model and guiding the model verification process to modes that had the lowest coverage statistics.

2. The method of claim 1, further comprising generating, for the identified at least one block, a third output port, wherein model verification of the model utilizes the first, second, and third output ports to perform the model verification.

3. The method of claim 1, further comprising flattening the obtained model to produce a directed graph that includes block connectivity information.

4. The method of claim 3, further comprising annotating the model, wherein the annotated model is analyzed/processed to identify the at least one block that has a branching structure.

5. The method of claim 1, wherein the model can contain one or more of hardware in the loop or software in the loop components.

6. A method for code verification, comprising:
   obtaining, by a processor, embedded code;
   identifying, by the processor, at least one block within the embedded code that has a branching structure;
   generating, by the processor, a first output variable based on an extracted extended finite state machine for the identified at least one block;
   combining, by the processor, the first output variable generated based on the extracted extended finite state machine with at least a second output variable of the system included in the embedded code; and
   performing, by the processor, coverage analysis and coverage guided falsification of the embedded code that utilizes the first and second output variable to verify the embedded code,
   wherein performing coverage guided falsification comprises:
     determining if a falsification process executed as part of the model verification process has terminated successfully or unsuccessfully;
     modifying the model verification process to perform a coverage-guided falsification process in which preference is first given to combinations of modes of the model that were evaluated as part of the model verification process and had the lowest coverage statistics based on the collected coverage statistics; and
     minimizing a robustness of the model and guiding the model verification process having the lowest coverage statistics.

* * * * *

UNITED STATES PATENT AND TRADEMARK OFFICE
CERTIFICATE OF CORRECTION

PATENT NO. : 10,409,706 B2  
APPLICATION NO. : 15/721243  
DATED : September 10, 2019  
INVENTOR(S) : Geogios Fainekos Page 1 of 1

It is certified that error appears in the above-identified patent and that said Letters Patent is hereby corrected as shown below:

In the Specification

Column 7, Line 15, "$\mathbb{Z}$" should be --$\mathbb{N}$--.

Column 7, Line 25, "$\mathbb{Z}$" should be --$\mathbb{N}$--.

Column 7, Line 33, "u$\in$ U$^{0,T}$" should be --$u\in$ U$^{0,T}$--.

Column 7, Line 37, "u$\in$ U$^{0,T}$" should be --$u\in$ U$^{0,T}$--.

Column 7, Line 50, "$\mathbb{Z}$" should be --$\mathbb{N}$--.

Column 7, Line 51, "$\mathbb{Z}$" should be --$\mathbb{N}$--.

Column 7, Line 52, "$\mathbb{Z}$" should be --$\mathbb{N}$--.

Signed and Sealed this  
Fifth Day of November, 2019

Andrei Iancu  
*Director of the United States Patent and Trademark Office*